US010386465B2

(12) United States Patent
Hall et al.

(10) Patent No.: US 10,386,465 B2
(45) Date of Patent: Aug. 20, 2019

(54) INTEGRATED LIDAR ILLUMINATION POWER CONTROL

(71) Applicant: Velodyne Lidar, Inc., Morgan Hill, CA (US)

(72) Inventors: David S. Hall, San Jose, CA (US); Raymond Liou, Cupertino, CA (US); Oren Milgrome, Richmond, CA (US); Marius Paul Dumitrean, San Jose, CA (US)

(73) Assignee: Velodyne Lidar, Inc., Morgan Hill, CA (US)

( * ) Notice: Subject to any disclaimer, the term of this patent is extended or adjusted under 35 U.S.C. 154(b) by 0 days.

(21) Appl. No.: 15/941,302

(22) Filed: Mar. 30, 2018

(65) Prior Publication Data

US 2018/0284227 A1 Oct. 4, 2018

Related U.S. Application Data

(60) Provisional application No. 62/480,119, filed on Mar. 31, 2017.

(51) Int. Cl.
  *G01S 7/484* (2006.01)
  *H01L 29/20* (2006.01)
  (Continued)

(52) U.S. Cl.
  CPC .......... *G01S 7/484* (2013.01); *G01S 7/4814* (2013.01); *H01L 23/528* (2013.01); *H01L 27/0605* (2013.01); *H01L 27/0629* (2013.01); *H01L 29/2003* (2013.01); *G01S 17/42* (2013.01); *H05K 1/181* (2013.01); *H05K 2201/10015* (2013.01); *H05K 2201/10022* (2013.01); *H05K 2201/10106* (2013.01); *H05K 2201/10121* (2013.01); *H05K 2201/10151* (2013.01); *H05K 2201/10166* (2013.01)

(58) Field of Classification Search
  CPC ........ G01S 7/484; G01S 7/4814; G01S 17/42; H01L 29/2003; H01L 27/0605; H01L 23/528; H01L 27/0629; H05K 1/181; H05K 2201/10151; H05K 2201/10166; H05K 2201/10121; H05K 2201/10022; H05K 2201/10015; H05K 2201/10106
  USPC ........................................................ 356/5.05
  See application file for complete search history.

(56) References Cited

U.S. PATENT DOCUMENTS 7,969,558 B2  6/2011  Hall
8,675,181 B2  3/2014  Hall
8,767,190 B2  7/2014  Hall

*Primary Examiner* — Daniel L Murphy
(74) *Attorney, Agent, or Firm* — Perkins Coie LLP

(57) ABSTRACT

Methods and systems for performing three dimensional LIDAR measurements with an integrated LIDAR measurement device are described herein. In one aspect, a Gallium Nitride (GaN) based illumination driver integrated circuit (IC), an illumination source, and a return signal receiver IC are mounted to a common substrate. The illumination driver IC provides a pulse of electrical power to the illumination source in response to a pulse trigger signal received from the return signal receiver IC. In another aspect, the GaN based illumination driver IC controls the amplitude, ramp rate, and duration of the pulse of electrical power based on command signals communicated from the return signal receiver IC to the illumination driver IC. In a further aspect, illumination driver IC reduces the amount of electrical power consumed by the illumination driver IC during periods of time when the illumination driver IC is not providing electrical power to the illumination source.

26 Claims, 15 Drawing Sheets

(51) Int. Cl.
G01S 7/481 (2006.01)
H01L 27/06 (2006.01)
H01L 23/528 (2006.01)
H05K 1/18 (2006.01)
G01S 17/42 (2006.01)

INTEGRATED LIDAR ILLUMINATION POWER CONTROL

CROSS REFERENCE TO RELATED APPLICATION

The present application for patent claims priority under 35 U.S.C. § 119 from U.S. provisional patent application Ser. No. 62/480,119, entitled "Integrated LIDAR Illumination Power Control," filed Mar. 31, 2017, the subject matter of which is incorporated herein by reference in its entirety.

TECHNICAL FIELD

The described embodiments relate to LIDAR based 3-D point cloud measuring systems.

BACKGROUND INFORMATION

LIDAR systems employ pulses of light to measure distance to an object based on the time of flight (TOF) of each pulse of light. A pulse of light emitted from a light source of a LIDAR system interacts with a distal object. A portion of the light reflects from the object and returns to a detector of the LIDAR system. Based on the time elapsed between emission of the pulse of light and detection of the returned pulse of light, a distance is estimated. In some examples, pulses of light are generated by a laser emitter. The light pulses are focused through a lens or lens assembly. The time it takes for a pulse of laser light to return to a detector mounted near the emitter is measured. A distance is derived from the time measurement with high accuracy.

Some LIDAR systems employ a single laser emitter/detector combination combined with a rotating mirror to effectively scan across a plane. Distance measurements performed by such a system are effectively two dimensional (i.e., planar), and the captured distance points are rendered as a 2-D (i.e. single plane) point cloud. In some examples, rotating mirrors are rotated at very fast speeds (e.g., thousands of revolutions per minute).

In many operational scenarios, a 3-D point cloud is required. A number of schemes have been employed to interrogate the surrounding environment in three dimensions. In some examples, a 2-D instrument is actuated up and down and/or back and forth, often on a gimbal. This is commonly known within the art as "winking" or "nodding" the sensor. Thus, a single beam LIDAR unit can be employed to capture an entire 3-D array of distance points, albeit one point at a time. In a related example, a prism is employed to "divide" the laser pulse into multiple layers, each having a slightly different vertical angle. This simulates the nodding effect described above, but without actuation of the sensor itself.

In all the above examples, the light path of a single laser emitter/detector combination is somehow altered to achieve a broader field of view than a single sensor. The number of pixels such devices can generate per unit time is inherently limited due limitations on the pulse repetition rate of a single laser. Any alteration of the beam path, whether it is by mirror, prism, or actuation of the device that achieves a larger coverage area comes at a cost of decreased point cloud density.

As noted above, 3-D point cloud systems exist in several configurations. However, in many applications it is necessary to see over a broad field of view. For example, in an autonomous vehicle application, the vertical field of view should extend down as close as possible to see the ground in front of the vehicle. In addition, the vertical field of view should extend above the horizon, in the event the car enters a dip in the road. In addition, it is necessary to have a minimum of delay between the actions happening in the real world and the imaging of those actions. In some examples, it is desirable to provide a complete image update at least five times per second. To address these requirements, a 3-D LIDAR system has been developed that includes an array of multiple laser emitters and detectors. This system is described in U.S. Pat. No. 7,969,558 issued on Jun. 28, 2011, the subject matter of which is incorporated herein by reference in its entirety.

In many applications, a sequence of pulses is emitted. The direction of each pulse is sequentially varied in rapid succession. In these examples, a distance measurement associated with each individual pulse can be considered a pixel, and a collection of pixels emitted and captured in rapid succession (i.e., "point cloud") can be rendered as an image or analyzed for other reasons (e.g., detecting obstacles). In some examples, viewing software is employed to render the resulting point clouds as images that appear three dimensional to a user. Different schemes can be used to depict the distance measurements as 3-D images that appear as if they were captured by a live action camera.

Some existing LIDAR systems employ an illumination source and a detector that are not integrated together onto a common substrate (e.g., electrical mounting board). Furthermore, the illumination beam path and the collection beam path are separated within the LIDAR device. This leads to opto-mechanical design complexity and alignment difficulty.

In addition, mechanical devices employed to scan the illumination beams in different directions may be sensitive to mechanical vibrations, inertial forces, and general environmental conditions. Without proper design these mechanical devices may degrade leading to loss of performance or failure.

To measure a 3D environment with high resolution and high throughput, the measurement pulses must be very short. Current systems suffer from low resolution because they are limited in their ability to generate short duration pulses.

Saturation of the detector limits measurement capability as target reflectivity and proximity vary greatly in realistic operating environments. In addition, power consumption may cause overheating of the LIDAR system. Light devices, targets, circuits, and temperatures vary in actual systems. The variability of all of these elements limits system performance without proper calibration of the photon output of each LIDAR device.

Improvements in the illumination drive electronics and receiver electronics of LIDAR systems are desired to improve imaging resolution and range.

SUMMARY

Methods and systems for performing three dimensional LIDAR measurements with an integrated LIDAR measurement device are described herein.

In one aspect, an illumination driver of a LIDAR measurement device is a GaN based integrated circuit (IC) that selectively couples an illumination source to a source of electrical power to generate a measurement pulse of illumination light in response to a pulse trigger signal. The GaN based illumination driver includes field effect transistors (FETs) that offer higher current density than conventional silicon based complementary metal oxide on silicon (CMOS) devices. As a result the GaN based illumination driver is able to deliver relatively large currents to an illumination source with significantly less power loss.

In a further aspect, a return pulse receiver IC receives a pulse command signal from a master controller and communicates the pulse trigger signal to the illumination driver IC in response to the pulse command signal. The pulse trigger signal also triggers data acquisition of the return signal and associated time of flight calculation by the return pulse receiver IC. In this manner, the pulse trigger signal generated based on the internal clock of receiver IC is employed to trigger both pulse generation and return pulse data acquisition. This ensures precise synchronization of pulse generation and return pulse acquisition which enables precise time of flight calculations by time-to-digital conversion.

In another further aspect, the return pulse receiver IC measures time of flight based on the time elapsed between the detection of a pulse due to internal cross-talk between the illumination source and the photodetector of the integrated LIDAR measurement device and a valid return pulse. In this manner, systematic delays are eliminated from the estimation of time of flight.

In another aspect, the illumination driver IC includes a number of different FETs configured to control the current flow through the illumination source. Moreover, the number of FETs coupled to the illumination source is selectable based on a digital FET selection signal. In some embodiments, the FET selection signal is communicated from the return pulse receiver IC to the illumination driver IC.

In another aspect, the illumination driver IC includes a power save control module that modulates the power supplied to a portion of the circuitry of the illumination driver IC to reduce power consumption. In operation, the illumination driver IC spends a relatively short amount of time generating a measurement pulse and a relatively long amount of time waiting for a trigger signal to generate the next measurement pulse. During these idle periods, the illumination driver IC reduces or eliminates power supplied to circuit components that do not need to be active for the entire waiting period.

In another aspect, the illumination driver IC includes a pulse initiation signal generator that generates a pulse initiation signal based on the pulse trigger signal. In addition, the illumination driver IC includes a pulse termination signal generator that generates a pulse termination signal. Together, the pulse initiation signals and the pulse termination signals directly determine the timing of the pulse generated by the illumination driver IC. The illumination driver IC generates a pulse of programmable duration based on a value of an analog pulse width control signal received from the return pulse receiver IC. The illumination driver generates a pulse termination signal having a delay from the pulse initiation signal based on the value of the pulse width control signal.

In another aspect, the illumination driver IC generates a pulse of programmable amplitude based on a value of an analog amplitude control signal received from the return pulse receiver IC.

In another aspect, a master controller is configured to generate a plurality of pulse command signals, each communicated to a different integrated LIDAR measurement device. Each return pulse receiver IC generates a corresponding pulse trigger signal based on the received pulse command signal.

The foregoing is a summary and thus contains, by necessity, simplifications, generalizations and omissions of detail; consequently, those skilled in the art will appreciate that the summary is illustrative only and is not limiting in any way.

Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Figure 1:
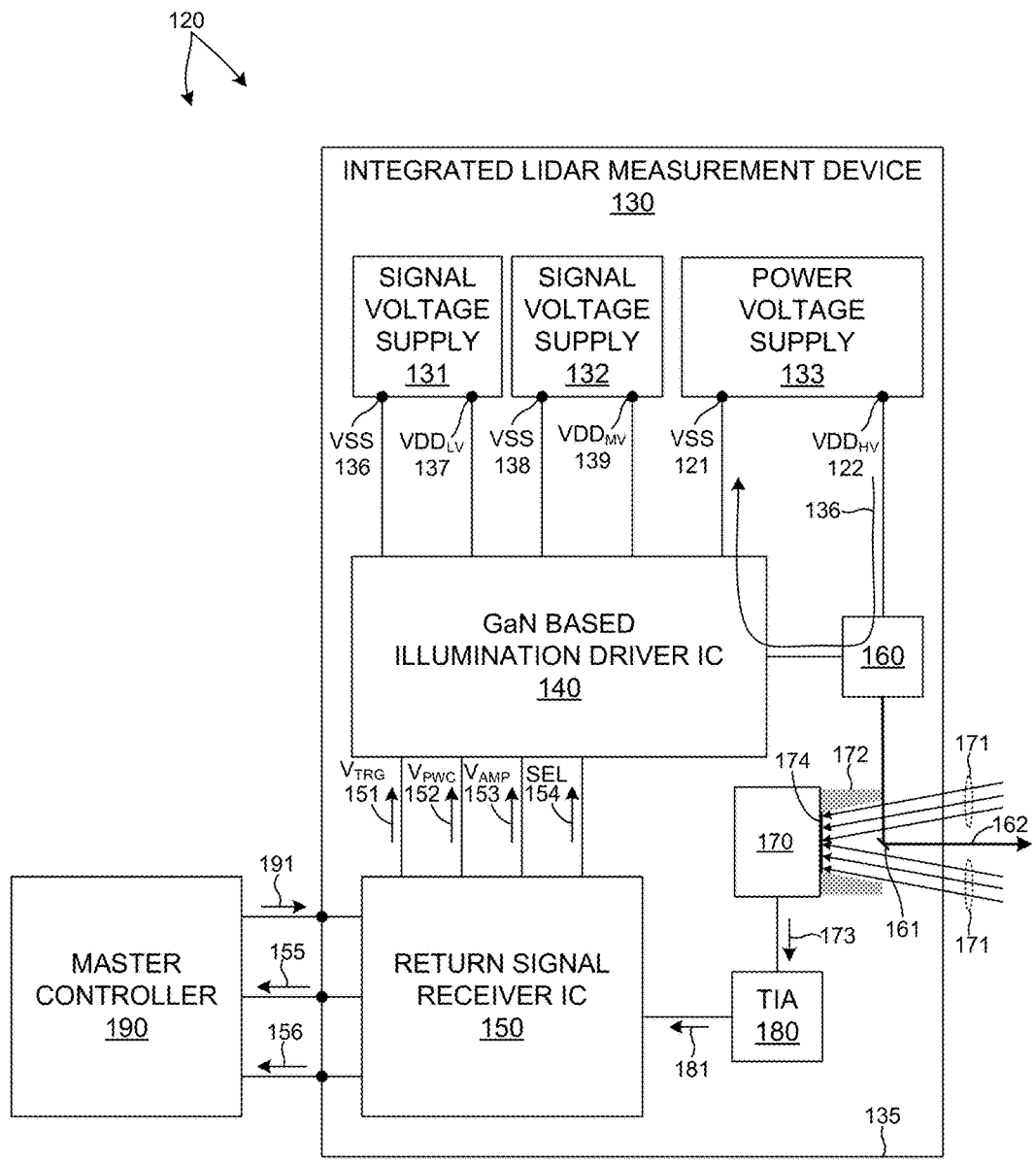
FIG. 1 is a simplified diagram illustrative of one embodiment of a LIDAR measurement system including at least on integrated LIDAR measurement device in at least one novel aspect.

FIG. 1 depicts an LIDAR measurement system 120 in one embodiment. LIDAR measurement system 120 includes a master controller 190 and one or more integrated LIDAR measurement devices 130. An integrated LIDAR measurement device 130 includes a return signal receiver integrated circuit (IC), a Gallium Nitride based illumination driver integrated circuit (IC) 140, an illumination source 160, a photodetector 170, and a trans-impedance amplifier (TIA) 180. Each of these elements is mounted to a common substrate 135 (e.g., printed circuit board) that provides mechanical support and electrical connectivity among the elements.

In addition, in some embodiments, an integrated LIDAR measurement device includes one or more voltage supplies that provide voltage to the electronic elements mounted to substrate 135 and electrical power to the illumination device 160. As depicted in FIG. 1, integrated LIDAR measurement device 130 includes a low signal voltage supply 131 configured to supply a relatively low voltage across nodes $VDD_{LV}$ 137 and VSS 136. In some embodiments, the voltage supplied by voltage supply 131 is approximately five volts. This voltage is selected to ensure that the voltage supplied at the gates of one or more of the transistors of illumination driver IC 140 does not exceed the damage threshold. In addition, integrated LIDAR measurement device 130 includes a medium signal voltage supply 132 configured to supply a voltage across nodes $VDD_{MV}$ 139 and VSS 138 that is higher than the voltage supplied by low voltage supply 131. In some embodiments, the voltage supplied by voltage supply 132 is approximately twelve volts. This voltage is selected to ensure fast switching transitions of one or more of the transistors of illumination driver IC 140. In addition, integrated LIDAR measurement device 130 includes a power voltage supply 133 configured to supply a voltage across nodes $VDD_{HV}$ 122 and VSS 121 that is higher than the voltage supplied by medium voltage supply 132. In some embodiments, the voltage supplied by voltage supply 133 is approximately fifteen to twenty volts. Voltage supply 133 is configured to supply high current 136 (e.g., one hundred amperes, or more) to illumination source 160 that causes illumination source 160 to emit a pulse of measurement light.

Although, preferred output voltages have been described herein, in general, supplies 131, 132, and 133 may be configured to supply any suitable voltage. In addition, the voltage supplies 131, 132, and 133 described with reference to FIG. 1 are mounted to substrate 135. However, in general, any of the power supplies described herein may be mounted to a separate substrate and electrically coupled to the various elements mounted to substrate 135 in any suitable manner. Although power supplies 131, 132, and 133 are described as voltage supplies with reference to FIG. 1, in general, any electrical power source described herein may be configured to supply electrical power specified as voltage or current. Hence, any electrical power source described herein as a voltage source or a current source may be contemplated as an equivalent current source or voltage source, respectively.

Illumination source 160 emits a measurement pulse of illumination light 162 in response to a pulse of electrical current 136. The illumination light 162 is focused and projected onto a particular location in the surrounding environment by one or more optical elements of the LIDAR system.

In some embodiments, the illumination source 160 is laser based (e.g., laser diode). In some embodiments, the illumination source is based on one or more light emitting diodes. In general, any suitable pulsed illumination source may be contemplated.

As depicted in FIG. 1, illumination light 162 emitted from integrated LIDAR measurement device 130 and corresponding return measurement light 171 directed toward integrated LIDAR measurement device share a common optical path. Integrated LIDAR measurement device 130 includes a photodetector 170 having an active sensor area 174. As depicted in FIG. 1, illumination source 160 is located outside the field of view of the active area 174 of the photodetector. As depicted in FIG. 1, an overmold lens 172 is mounted over the photodetector 170. The overmold lens 172 includes a conical cavity that corresponds with the ray acceptance cone of return light 171. Illumination light 162 from illumination source 160 is injected into the detector reception cone by a fiber waveguide. An optical coupler optically couples illumination source 160 with the fiber waveguide. At the end of the fiber waveguide, a mirror element 161 is oriented at a 45 degree angle with respect to the waveguide to inject the illumination light 162 into the cone of return light 171. In one embodiment, the end faces of fiber waveguide are cut at a 45 degree angle and the end faces are coated with a highly reflective dielectric coating to provide a mirror surface. In some embodiments, the waveguide includes a rectangular shaped glass core and a polymer cladding of lower index of refraction. In some embodiments, the entire optical assembly is encapsulated with a material having an index of refraction that closely matches the index of refraction of the polymer cladding. In this manner, the waveguide injects the illumination light 162 into the acceptance cone of return light 171 with minimal occlusion.

The placement of the waveguide within the acceptance cone of the return light 171 projected onto the active sensing area 174 of detector 170 is selected to ensure that the illumination spot and the detector field of view have maximum overlap in the far field.

As depicted in FIG. 1, return light 171 reflected from the surrounding environment is detected by photodetector 170. In some embodiments, photodetector 170 is an avalanche photodiode. Photodetector 170 generates an output signal 173 that is amplified by an analog trans-impedance amplifier (TIA) 180. However, in general, the amplification of output signal 173 may include multiple, amplifier stages. In this sense, an analog trans-impedance amplifier is provided by way of non-limiting example, as many other analog signal amplification schemes may be contemplated within the scope of this patent document. Although TIA 180 is depicted in FIG. 1 as a discrete device separate from the receiver IC 150, in general, TIA 180 may be integrated with receiver IC 150. In some embodiments, it is preferable to integrate TIA 180 with receiver IC 150 to save space and reduce signal contamination.

As depicted in FIG. 1, the amplified signal 181 is communicated to return signal receiver IC 150. Receiver IC 150 includes timing circuitry and a time-to-digital converter that estimates the time of flight of the measurement pulse from illumination source 160, to a reflective object in the three dimensional environment, and back to the photodetector 170. A signal 155 indicative of the estimated time of flight is communicated to master controller 190 for further processing and communication to a user of the LIDAR measurement system 120. In addition, return signal receiver IC 150 is configured to digitize segments of the return signal 181 that include peak values (i.e., return pulses), and communicate signals 156 indicative of the digitized segments to master controller 190. In some embodiments, master controller 190 processes these signal segments to identify properties of the detected object. In some embodiments, master controller 190 communicates signals 156 to a user of the LIDAR measurement system 120 for further processing.

Master controller 190 is configured to generate a pulse command signal 191 that is communicated to receiver IC 150 of integrated LIDAR measurement device 130. In general, a LIDAR measurement system includes a number of different integrated LIDAR measurement devices 130. In these embodiments, master controller 190 communicates a pulse command signal 191 to each different integrated LIDAR measurement device. In this manner, master controller 190 coordinates the timing of LIDAR measurements performed by any number of integrated LIDAR measurement devices.

Pulse command signal 191 is a digital signal generated by master controller 190. Thus, the timing of pulse command signal 191 is determined by a clock associated with master controller 190. In some embodiments, the pulse command signal 191 is directly used to trigger pulse generation by illumination driver IC 140 and data acquisition by receiver IC 150. However, illumination driver IC 140 and receiver IC 150 do not share the same clock as master controller 190. For this reason, precise estimation of time of flight becomes much more computationally tedious when the pulse command signal 191 is directly used to trigger pulse generation and data acquisition.

In one aspect, receiver IC 150 receives pulse command signal 191 and generates a pulse trigger signal, $V_{TRG}$ 151, in response to the pulse command signal 191. Pulse trigger signal 151 is communicated to illumination driver IC 140 and directly triggers illumination driver IC 140 to electrically couple illumination source 160 to power supply 133 and generate a pulse of illumination light 162. In addition, pulse trigger signal 151 directly triggers data acquisition of return signal 181 and associated time of flight calculation. In this manner, pulse trigger signal 151 generated based on the internal clock of receiver IC 150 is employed to trigger both pulse generation and return pulse data acquisition. This ensures precise synchronization of pulse generation and return pulse acquisition which enables precise time of flight calculations by time-to-digital conversion.

Figure 2:
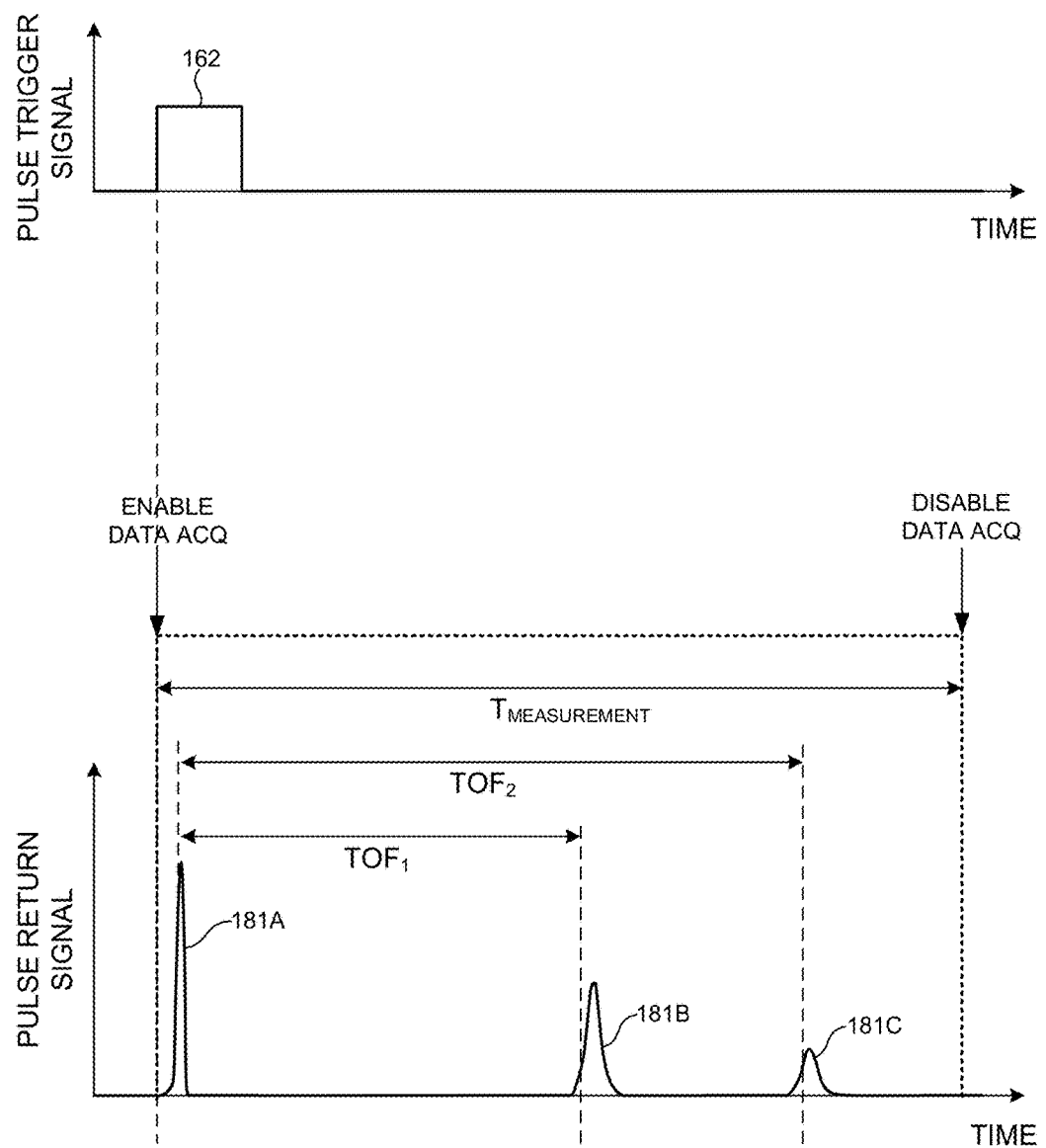
FIG. 2 depicts an illustration of the timing associated with the emission of a measurement pulse from an integrated LIDAR measurement device 130 and capture of the returning measurement pulse.

FIG. 2 depicts an illustration of the timing associated with the emission of a measurement pulse from an integrated LIDAR measurement device 130 and capture of the returning measurement pulse. As depicted in FIG. 2, a measurement is initiated by the rising edge of pulse trigger signal 162 generated by receiver IC 150. As depicted in FIGS. 1 and 2, an amplified, return signal 181 is received by receiver IC 150. As described hereinbefore, a measurement window (i.e., a period of time over which collected return signal data is associated with a particular measurement pulse) is initiated by enabling data acquisition at the rising edge of pulse trigger signal 162. Receiver IC 150 controls the duration of the measurement window, $T_{measurement}$, to correspond with the window of time when a return signal is expected in response to the emission of a measurement pulse sequence. In some examples, the measurement window is enabled at the rising edge of pulse trigger signal 162 and is disabled at a time corresponding to the time of flight of light over a distance that is approximately twice the range of the LIDAR system. In this manner, the measurement window is open to collect return light from objects adjacent to the LIDAR system (i.e., negligible time of flight) to objects that are located at the maximum range of the LIDAR system. In this manner, all other light that cannot possibly contribute to useful return signal is rejected.

As depicted in FIG. 2, return signal 181 includes three return measurement pulses that correspond with the emitted measurement pulse. In general, signal detection is performed on all detected measurement pulses. Further signal analysis may be performed to identify the closest valid signal 181B (i.e., first valid instance of the return measurement pulse), the strongest signal, and the furthest valid signal 181C (i.e., last valid instance of the return measurement pulse in the measurement window). Any of these instances may be reported as potentially valid distance measurements by the LIDAR system.

Internal system delays associated with emission of light from the LIDAR system (e.g., signal communication delays and latency associated with the switching elements, energy storage elements, and pulsed light emitting device) and delays associated with collecting light and generating signals indicative of the collected light (e.g., amplifier latency, analog-digital conversion delay, etc.) contribute to errors in the estimation of the time of flight of a measurement pulse of light. Thus, measurement of time of flight based on the elapsed time between the rising edge of the pulse trigger signal 162 and each valid return pulse (i.e., 181B and 181C) introduces undesireable measurement error. In some embodiments, a calibrated, pre-determined delay time is employed to compensate for the electronic delays to arrive at a corrected estimate of the actual optical time of flight. However, the accuracy of a static correction to dynamically changing electronic delays is limited. Although, frequent re-calibrations may be employed, this comes at a cost of computational complexity and may interfere with system up-time.

In another aspect, receiver IC 150 measures time of flight based on the time elapsed between the detection of a detected pulse 181A due to internal cross-talk between the illumination source 160 and photodetector 170 and a valid return pulse (e.g., 181B and 181C). In this manner, systematic delays are eliminated from the estimation of time of flight. Pulse 181A is generated by internal cross-talk with effectively no distance of light propagation. Thus, the delay in time from the rising edge of the pulse trigger signal and the instance of detection of pulse 181A captures captures all of the systematic delays associated with illumination and signal detection. By measuring the time of flight of valid return pulses (e.g., return pulses 181B and 181C) with reference to detected pulse 181A, all of the systematic delays associated with illumination and signal detection due to internal cross-talk are eliminated. As depicted in FIG. 2, receiver IC 150 estimates the time of flight, $TOF_1$, associated with return pulse 181B and the time of flight, $TOF_2$, associated with return pulse 181C with reference to return pulse 181A.

In some embodiments, the signal analysis is performed by receiver IC 150, entirely. In these embodiments, signals 155 communicated from integrated LIDAR measurement device 130 include an indication of the time of flight determined by receiver IC 150. In some embodiments, signals 156 include digitized segments of return signal 181 generated by receiver IC 150. These raw measurement signal segments are processed further by one or more processors located on board the 3-D LIDAR system, or external to the 3-D LIDAR system to arrive at another estimate of distance, an estimate of one of more physical properties of the detected object, or a combination thereof.

In one aspect, an illumination driver of a LIDAR measurement device is a GaN based IC that selectively couples an illumination source to a source of electrical power to generate a measurement pulse of illumination light in response to a pulse trigger signal. The GaN based illumination driver includes field effect transistors (FETs) that offer higher current density than conventional silicon based complementary metal oxide on silicon (CMOS) devices. As a result the GaN based illumination driver is able to deliver relatively large currents to an illumination source with significantly less power loss than a silicon based driver.

As depicted in FIG. 1, illumination driver IC 140 is coupled to a voltage node 121 of power voltage supply 133 and a node of illumination source 160. Another node of illumination source 160 is coupled to voltage node 122 of power voltage supply 133. In response to pulse trigger signal 151, a field effect transistor (FET) of illumination driver IC 140 becomes substantially conductive, and effectively couples illumination source 160 to node 121. This induces a high current flow 136 through illumination source 160, which stimulates the emission of a measurement pulse of illumination light 162.

Figure 3:
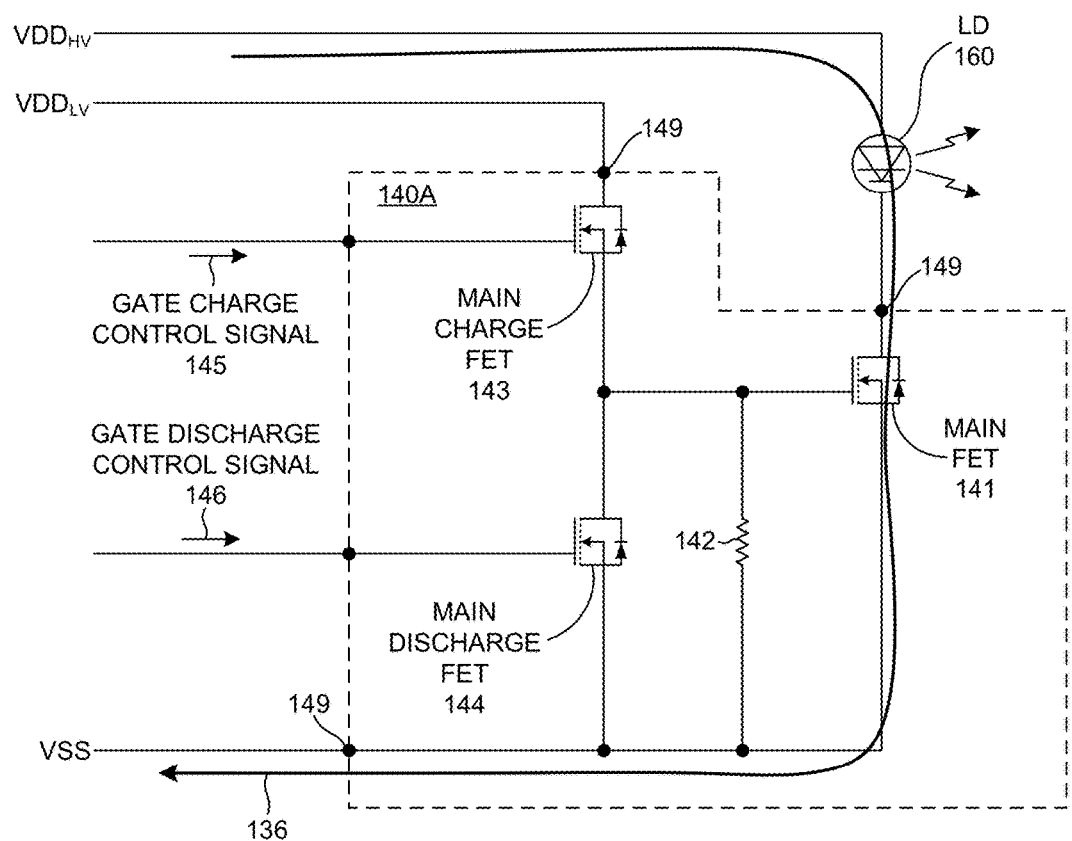
FIG. 3 depicts a simplified diagram illustrative of an illumination driver IC in one embodiment.

FIG. 3 depicts an embodiment 140A of illumination driver IC 140. In a further aspect, GaN based illumination driver IC 140A includes three FETs 141, 143, and 144 integrated onto a common GaN based IC. Main FET 141 controls the flow of current through illumination source 160 (e.g., laser diode 160). But, two additional transistors, main charge FET 143 and main discharge FET 144 control the gate voltage to main FET 141 to accelerate the transitions and minimize power losses.

As depicted in FIG. 3, the drain of main charge FET 143 is coupled to voltage node 137 of low voltage supply 131 depicted in FIG. 1. The source of main charge FET 143 is coupled to the drain of main discharge FET 144 and to the gate of main FET 141. The source of main discharge FET 144 is coupled to voltage node 136 of low voltage supply 131. In addition, a resistor is coupled between the gate of main FET 141 and voltage node 136 of low voltage supply 131. A gate charge control signal 145 is provided at the gate of main charge FET 143, and a gate discharge control signal 146 is provided at the gate of main discharge FET 144. In this manner, gate charge control signal 145 and gate discharge control signal 144 determine the charge at the gate of main FET 141, and thus the conductive state of main FET 141. In one example, the gate charge control signal is the pulse trigger signal 151 and the gate discharge control signal is the inverse of pulse trigger signal 151.

The embodiment 140A of illumination driver IC 140 depicted in FIG. 3 includes a single main FET 141 that determines the current flow through illumination source 160. In another aspect, illumination driver IC 140 includes a number of different FETs configured to control the current flow through illumination source 160. Moreover, the number of FETs coupled to the illumination source is programmable. This enables a programmable maximum current flow through illumination source 160, and thus a programmable maximum illumination pulse amplitude.

Figure 4:
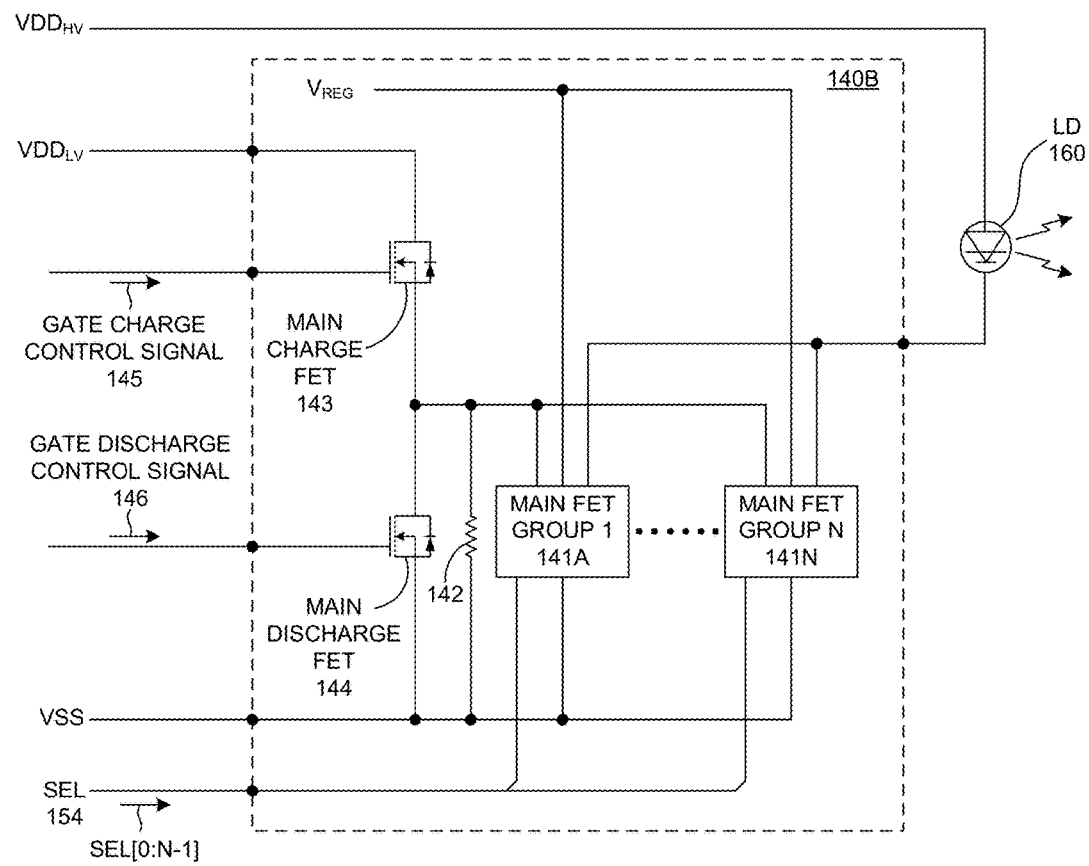
FIG. 4 depicts a simplified diagram illustrative of an illumination driver IC in another embodiment.

FIG. 4 depicts an embodiment 140B of illumination driver IC 140. Like numbered elements are described with reference to FIG. 3. As depicted in FIG. 4, N groups of one or more FETs are coupled in parallel with illumination source 160, where N is any positive, integer number. A drain of each main FET of each FET group 141A-141N is coupled to a node of illumination source 160. Similarly, a source of each main FET of each FET group 141A-141N is coupled to node 121 of power voltage supply 133. The gates of each main FET of each FET group 141A-141N are selectively coupled to the source of main charge FET 143 and the drain of main discharge FET 144. Whether each main FET of a particular group of FETs is electrically coupled to the source of main charge FET 143 and the drain of main discharge FET 144 is determined by the state of selection signal, SEL, 154 received from receiver IC 150. In the example depicted in FIG. 4, SEL is an N-bit word. Each bit corresponds with a particular main FET group. If a particular bit is in a high state, each main FET associated with the corresponding main FET group is coupled to the source of main charge FET 143 and the drain of main discharge FET 144. In this state, gate charge control signal 145 and gate discharge control signal 144 determine the charge at the gate of each main FET of the corresponding main FET group. In this manner, the state of each bit of the N-bit word determines which main FET groups will participate in pulse generation by illumination source 160.

Receiver IC 150 determines which FET groups should participate in the next measurement pulse by generating and communicating the SEL signal to illumination driver IC 140. In some examples, the determination is based on the return signal received from the prior measurement pulse. For example, if the received return signal is saturated, receiver IC 150 generates and communicates a selection signal, SEL, to illumination driver 140 with a larger number of zero valued bits to reduce the number of participating main FET groups. In this manner, the number of photons emitted in the next illumination pulse is reduced.

In some embodiments, the number of FETS in each main FET group is different. In this manner, different combinations of FET groups can be activated to achieve a wide range of participating FETs with uniform resolution.

Figure 5:
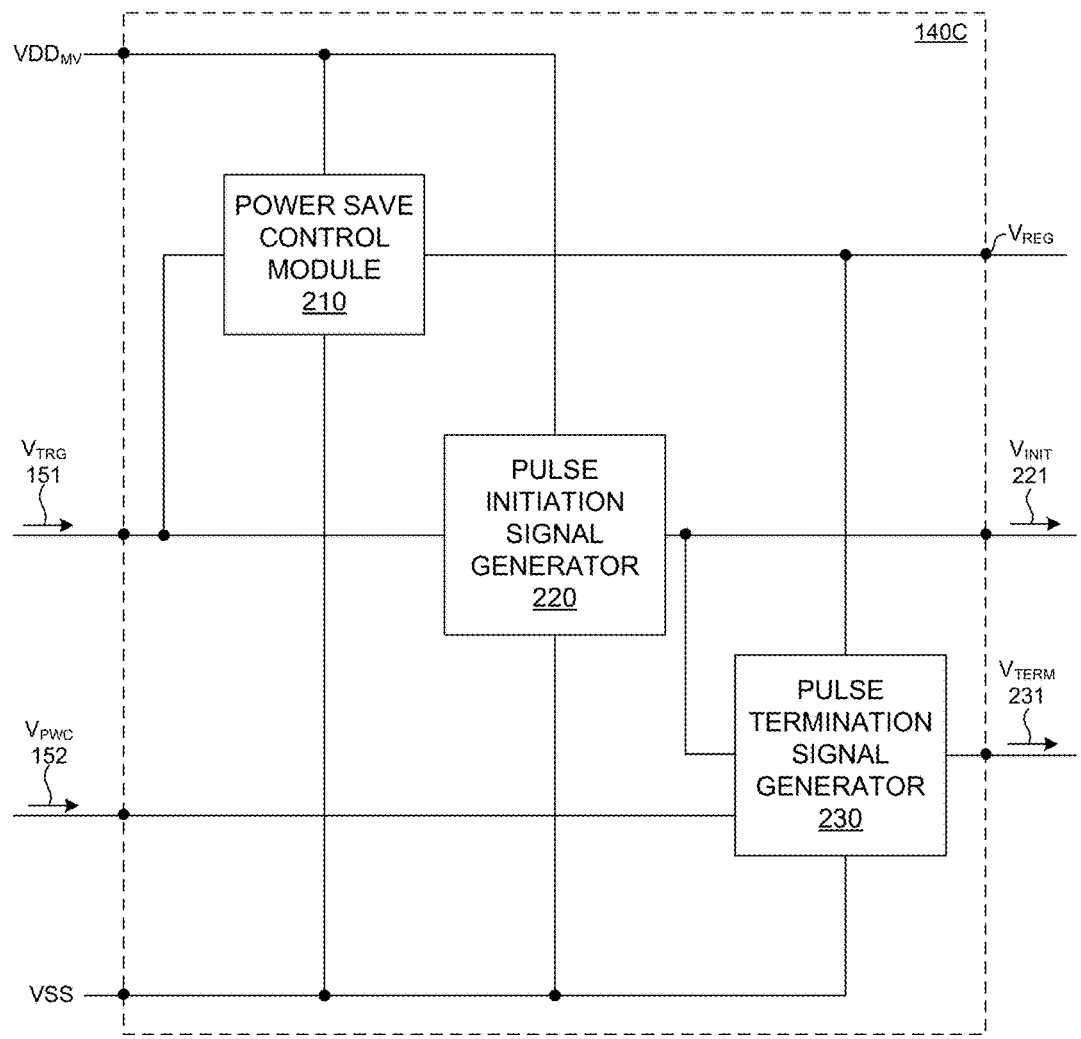
FIG. 5 depicts a simplified diagram illustrative of one embodiment of a portion of an illumination driver IC including a power save control module, a pulse initiation signal generator, and a pulse termination signal generator.

FIG. 5 depicts one embodiment 140C of a portion of illumination driver IC 140. As depicted in FIG. 5, illumination driver IC 140C includes a power save control module 210, a pulse initiation signal generator 220, and a pulse termination signal generator 230.

In another aspect, illumination driver IC 140 includes a power save control module that modulates the power supplied to a portion of the circuitry of illumination driver IC 140 to reduce power consumption. In operation, the illumination driver IC 140 spends a relatively short amount of time generating a measurement pulse and a relatively long amount of time waiting for a trigger signal to generate the next measurement pulse. During these idle periods, it is desireable to reduce or eliminate power supplied to circuit components that do not need to be active for the entire waiting period. As depicted in FIG. 5, power save control module 210 is coupled between voltage nodes $VDD_{MV}$ and VSS of signal voltage supply 132 depicted in FIG. 1. In addition, power save control module 210 receives pulse trigger signal 151 from receiver IC 150 and, in response, generates a regulated voltage, $V_{reg}$, that is supplied to various portion of illumination driver IC 140. For example, $V_{reg}$ is provided to the main FET groups 141A-N depicted in FIG. 4, pulse amplitude control circuit 250 depicted in FIG. 9, and pulse termination signal generator 230 depicted in FIG. 5.

Figure 6:
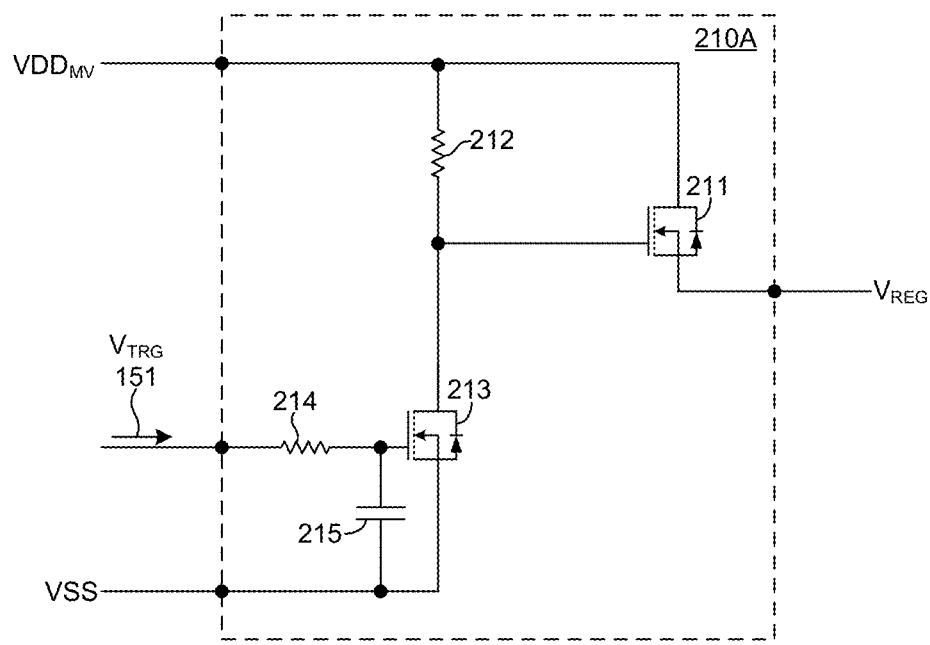
FIG. 6 depicts an embodiment of a power save control module in further detail.

FIG. 6 depicts an embodiment 210A of power save control module 210. Power save control module 210A includes a resistor 214. Pulse trigger signal 151 is provided on a first node of resistor 214. A second node of resistor 214 is coupled to a first node of capacitor 215. The other node of capacitor 215 is coupled to node 138 of signal voltage supply 132 depicted in FIG. 1. Power save control module 210A also includes a FET 213 having a source coupled to node 138 of signal voltage supply 132, a gate coupled to the second node of resistor 214, and a drain coupled to that gate of FET 211. The drain of FET 211 is coupled to a node 139 of signal voltage supply 132, and the regulated voltage, $V_{reg}$, is provided at the source of FET 211. Resistor 214 and capacitor 215 create an RC network that introduces a delay at the gate of FET 213. This introduces a delay ($T_{D-SLEEP}$ depicted in FIG. 10) between the rising edge of $V_{TRG}$ and the time when $V_{REG}$ drops to VSS during sleep mode.

Figure 10:
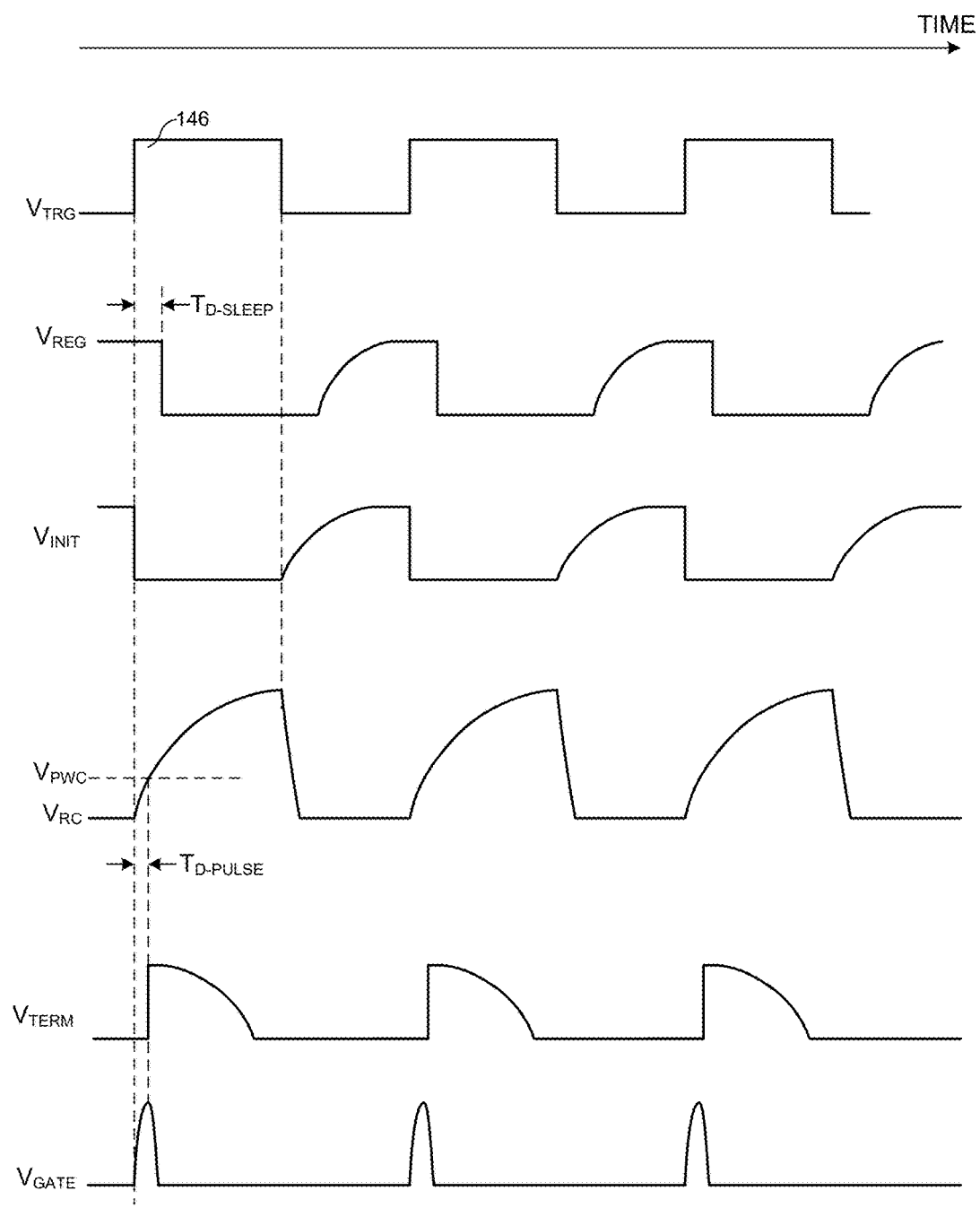
FIG. 10 depicts a simplified illustration of the changes in the regulated voltage, VREG, generated by a power save control module in response to the pulse trigger signal.

FIG. 10 depicts a simplified illustration of the changes in the regulated voltage, $V_{REG}$, generated by the power save control module 210 in response to the pulse trigger signal, $V_{TRG}$. As depicted in FIG. 10, at the rising edge of the pulse trigger signal, the regulated voltage remains high for a period of time, $T_{D-SLEEP}$. This length of time is determined by the values of resistor 214 and capacitor 215. After this period of time, the $V_{REG}$ drops quickly. At the falling edge of VTRG, the regulated voltage remains low for a period of time and then ramps up to a relatively high voltage value, so that the illumination driver IC 140 is ready to generate a measurement pulse in response to the subsequent rising edge of $V_{TRG}$.

In another aspect, illumination driver IC 140 includes a pulse initiation signal generator 220 that generates a pulse initiation signal, $V_{init}$, to a portion of the GaN based illumination driver IC based on the pulse trigger signal. In addition, illumination driver IC 140 includes a pulse termination signal generator 230 that generates a pulse termination signal, $V_{term}$, to a portion of the GaN based illumination driver IC based on the pulse initiation signal. Together, the pulse initiation signals and the pulse termination signals directly determine the timing of the pulse generated by illumination driver IC 140. In other words, in some embodiments, rather than having the pulse trigger signal 151 directly determine the timing of the pulse generated by illumination driver IC 140, the pulse trigger signal 151 is employed to trigger the generation of the pulse initiation signal. The pulse initiation signal, in turn, directly initiates the pulse generation, and also initiates the generation of the pulse termination signal. The pulse termination signal, in turn, directly terminates the pulse generation.

Figure 7:
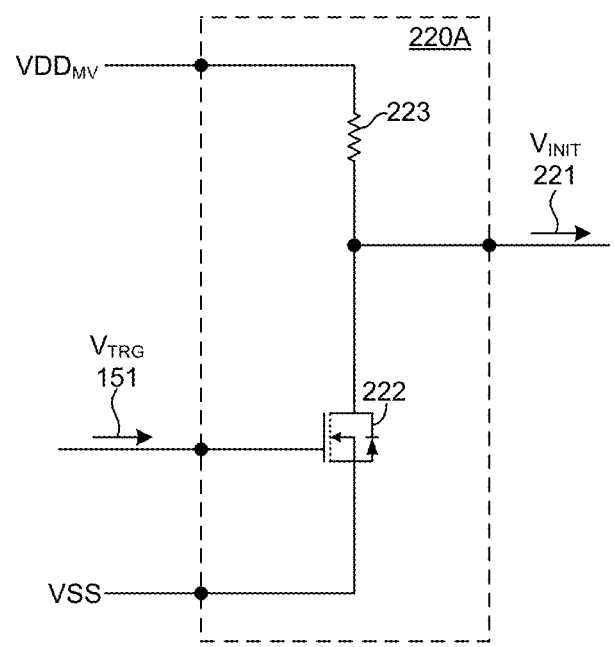
FIG. 7 depicts an embodiment a pulse initiation signal generator in further detail.

FIG. 7 depicts an embodiment 220A of pulse initiation signal generator 220. Pulse initiation signal generator 220A includes a FET 222 and a resistor 223. Pulse trigger signal 151 is provided on the gate of FET 222. The source of FET 222 is coupled to node 138 of signal voltage supply 132 depicted in FIG. 1. A first node of resistor 223 is coupled to node 139 of signal voltage supply 132 and a second node of resistor 223 is coupled to the drain of FET 222. Pulse initiation signal 221 is provided at the drain of FET 222.

FIG. 10 depicts a simplified illustration of the changes in the pulse initiation signal, $V_{INIT}$, generated by the pulse initiation signal generator 220 in response to the pulse trigger signal, $V_{TRG}$. As depicted in FIG. 10, at the rising edge of the pulse trigger signal, $V_{INIT}$, drops to a low voltage value, VSS, very quickly. At the falling edge of $V_{TRG}$, $V_{INIT}$ ramps up to the value of $VDD_{MV}$, so that the illumination driver IC 140 is ready to generate a pulse initiation signal in response to the subsequent rising edge of $V_{TRG}$.

In another aspect, pulse termination signal generator 230 is configured to generate a pulse of programmable duration based on a value of an analog input signal. As depicted in FIG. 1, receiver IC 150 generates an analog pulse width control signal, $V_{PWC}$ 152, and communicates $V_{PWC}$ to illumination driver IC 140. In response, illumination driver IC 140 changes the pulse duration based on the received value of $V_{PWC}$. In the embodiment depicted in FIG. 5, pulse termination signal generator 230 receives, $V_{PWC}$ and $V_{INIT}$ and generates a pulse termination signal, $V_{TERM}$, having a delay from $V_{INIT}$ programmed in accordance with a value of $V_{PWC}$.

Figure 8:
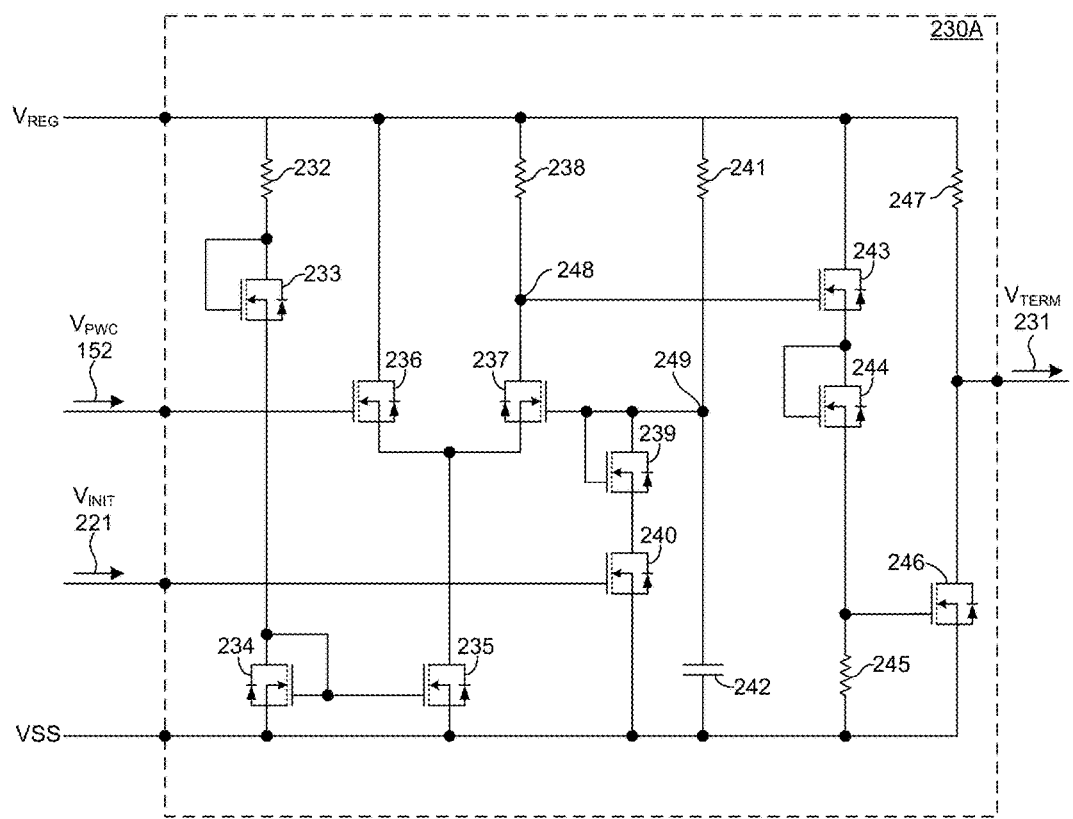
FIG. 8 depicts an embodiment a pulse termination signal generator in further detail.

FIG. 8 depicts an embodiment 230A of pulse termination signal generator 230. Pulse termination signal generator 230 includes resistor 238 and FETs 236-237 configured as an operational amplifier. The output of the operational amplifier is coupled to the gate of FET 243. The operational amplifier receives $V_{PWC}$ as input at the gate of FET 236. In addition, the operational amplifier receives an input voltage 249 at the gate of FET 237. When the input voltage 249 exceeds the value of $V_{PWC}$, the value of output voltage 248 switches transitions to a low value. When the value of $V_{PWC}$ exceeds the value of input voltage 249, the value of output voltage 248 transitions to a high value. Input voltage 249 is the voltage of the RC circuit formed by resistor 241 and capacitor 242. $V_{INIT}$ is received at the gate of FET 240. When $V_{INIT}$ transitions to a low value (at the start of pulse), FET 240 effectively disconnects the RC circuit from VSS. This allows the RC circuit to begin to charge. FET 239 provides a nonzero starting voltage for the RC circuit. As the voltage of the RC circuit rises, eventually it exceeds the value of $V_{PWC}$, thus triggering the transition of output node 248. Since the voltage ramp rate of the RC circuit is constant, the delay until the transition of output voltage 248 is determined in part by the value of $V_{PWC}$. The larger the value of $V_{PWC}$, the longer the delay from pulse initiation before the generation of the termination signal, $V_{TERM}$. In this manner, the value of $V_{PWC}$ determines the pulse duration. Pulse termination signal generator 230 includes resistor 232 and FETs 233-235 configured as a current source for the operational amplifier structure. FETS 243 and 244 are configured to scale down the value of output voltage 248. Resistors 245 and 247 and FET 246 are configured to invert the scaled value of output voltage 248. The pulse termination signal, $V_{TERM}$, is provided at the drain of FET 246.

FIG. 10 depicts a simplified illustration of the changes in the pulse termination signal, $V_{TERM}$, generated by the pulse termination signal generator 230 in response to the pulse initiation signal, $V_{INIT}$ and the pulse width control signal, $V_{PWC}$. As depicted in FIG. 10, when VINIT goes low, the voltage of the RC circuit begins to ramp up. At the point in time when the voltage of the RC circuit exceeds $V_{PWC}$, $V_{TERM}$ goes high, holds for a period of time and then ramps down again. Note that the period of time, $T_{D-PULSE}$ between pulse initiation and the rising edge of $V_{TERM}$ determines the relative duration of the measurement pulse. At the falling edge of $V_{TRG}$, $V_{TERM}$ ramps down again so that the illumination driver IC 140 is ready to generate a pulse termination signal for the subsequent pulse. As depicted, in FIG. 10, the gate voltage, $V_{GATE}$, of main FET 141 is also depicted.

In another aspect, pulse termination signal generator 230 is configured to generate a pulse of programmable amplitude based on a value of an analog input signal. As depicted in FIG. 1, receiver IC 150 generates an analog amplitude control signal, $V_{AMP}$ 153, and communicates $V_{AMP}$ to illumination driver IC 140. In response, illumination driver IC 140 changes the pulse amplitude based on the received value of $V_{AMP}$.

Figure 9:
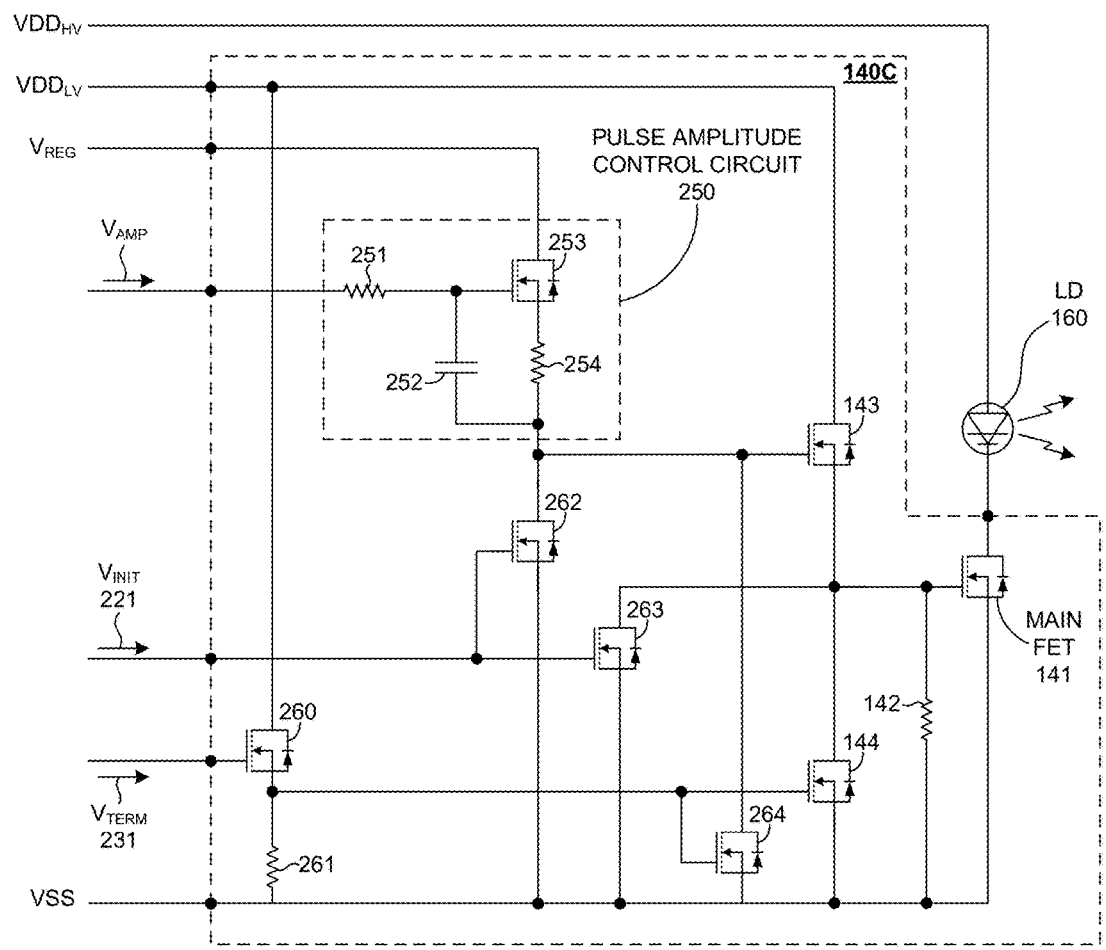
FIG. 9 depicts an embodiment of a pulse amplitude control circuit in further detail.

In the embodiment 140C of portions of illumination driver IC 140 depicted in FIG. 9, pulse amplitude control circuit 250 receives, $V_{AMP}$, that controls the amplitude of the pulse generated by illumination source 160.

When $V_{INIT}$ goes low (signaling the start of a measurement pulse), FET 262 quickly releases the gate of main charge FET 143 from VSS, allowing main charge FET 143 to quickly charge. Similarly, FET 263 quickly releases the gate of main FET 141 from VSS, allowing main FET 141 to charge.

When $V_{TERM}$ goes high (signaling the end of a measurement pulse), FET 264 shorts the gate of charge FET 143 to VSS. Similarly, main discharge FET 144 shorts the gate of main FET 141 to VSS as quickly as possible to shut off current flow through illumination source 160.

FET 260 and resistor 261 provide a quick turn-on of main discharge FET 144 and discharge FET 264.

In addition, pulse amplitude control circuit 250 includes resistors 251 and 254, capacitor 252, and FET 253. Pulse amplitude control signal, $V_{AMP}$, is received on a first node of resistor 251. The second node of resistor 251 is coupled to the gate of FET 253 and to a first node of capacitor 252.

The drain of FET 253 is coupled to the regulated voltage supply, VREG. The source of FET 253 is coupled to a first node of resistor 254. The second node of resistor 254 is coupled to the second node of capacitor 252, which is coupled to the gate of main charge FET 143. In this manner, the pulse amplitude control circuit 250 controls the charge at the gate of main charge FET 143.

As depicted in FIG. 9, the value of $V_{AMP}$ controls the ramp rate of the pulse amplitude control circuit 250. As $V_{AMP}$ increases, the rate of charge accumulation at the gate of FET 253 increases. In turn, this increases rate of charge accumulation on the gate of main charge FET 143. This, in turn, increases the rate of charge accumulation on the gate of main FET 141, which accelerates the ramp rate of the resulting illumination pulse generated by illumination source 160. In this manner, $V_{AMP}$, controls the peak amplitude of the illumination pulse for a given pulse duration.

In another aspect, a master controller is configured to generate a plurality of pulse command signals, each communicated to a different integrated LIDAR measurement device. Each return pulse receiver IC generates a corresponding pulse trigger signal based on the received pulse command signal.

Figure 11:
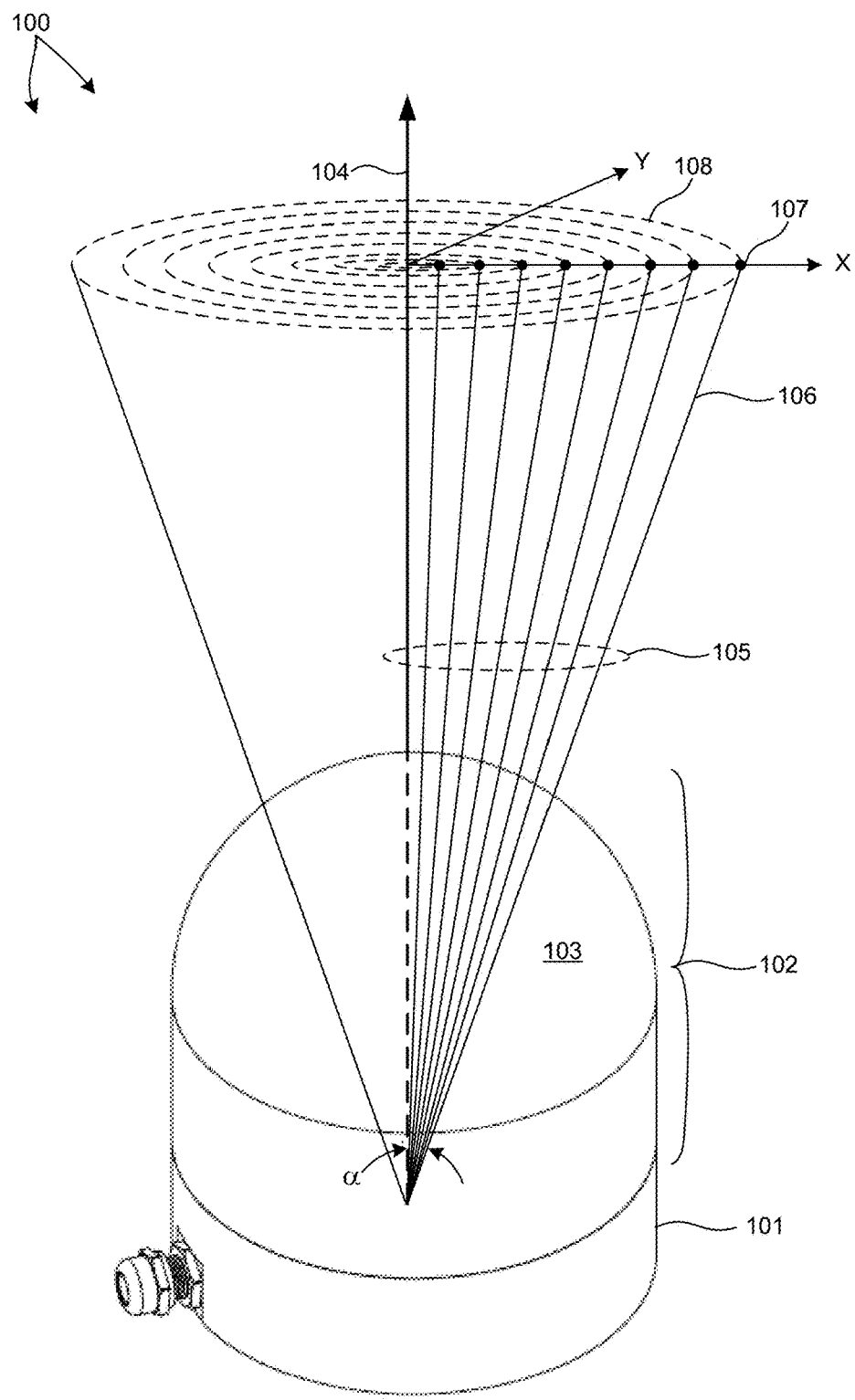
FIG. 11 is a diagram illustrative of an embodiment of a 3-D LIDAR system 100 in one exemplary operational scenario.
Figure 12:
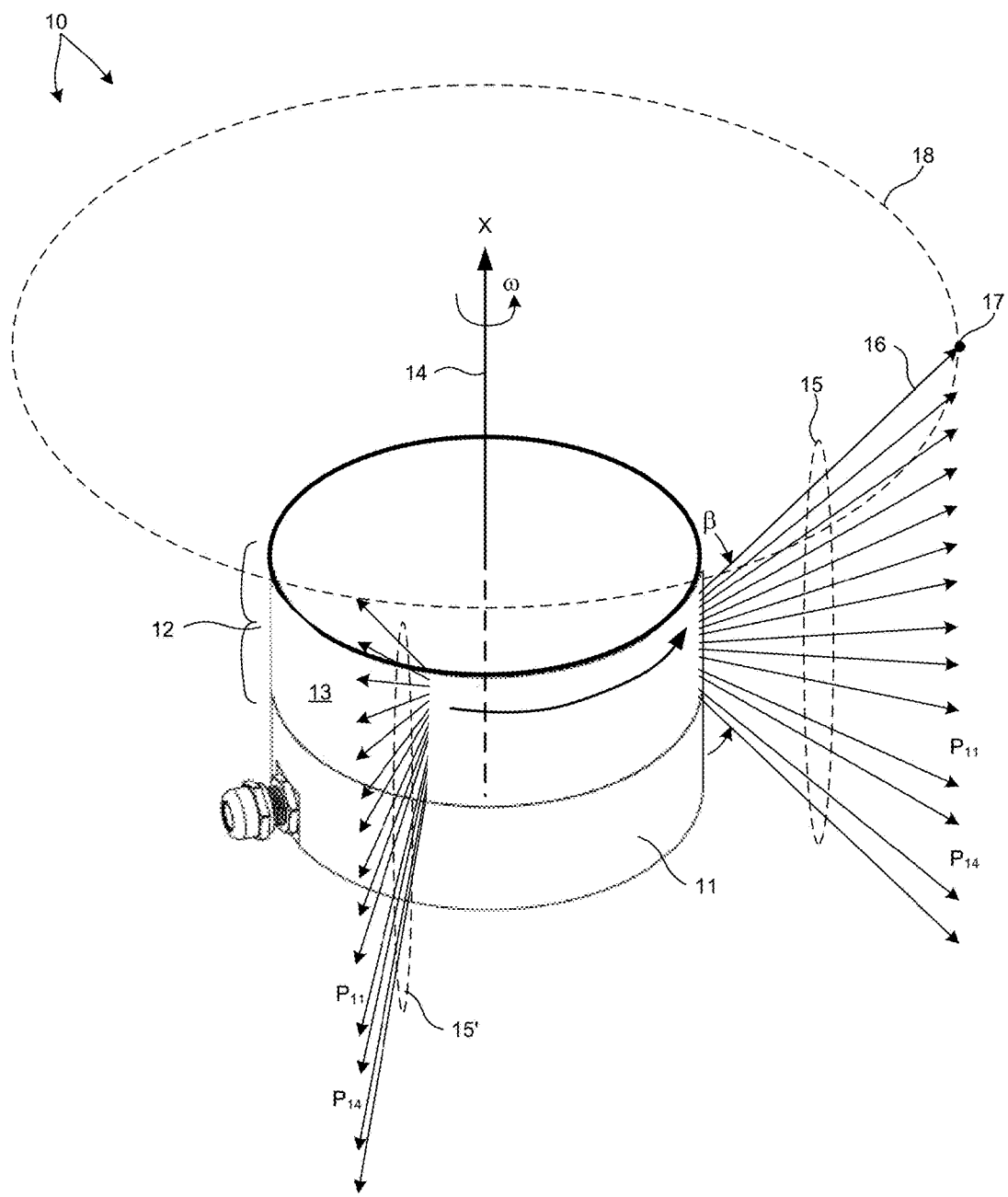
FIG. 12 is a diagram illustrative of another embodiment of a 3-D LIDAR system 10 in one exemplary operational scenario.
Figure 13:
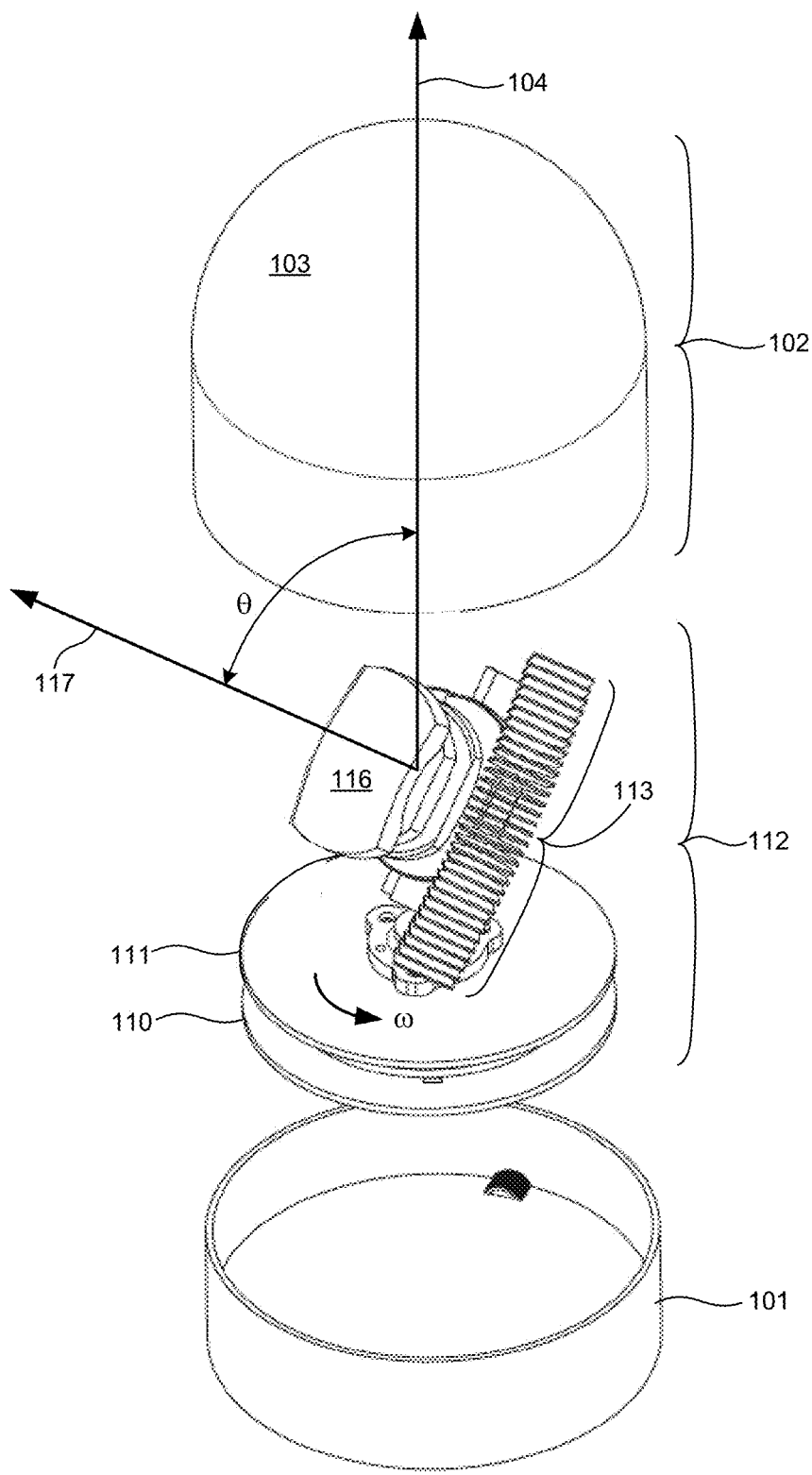
FIG. 13 depicts a diagram illustrative of an exploded view of 3-D LIDAR system 100 in one exemplary embodiment.

FIGS. 11-13 depict 3-D LIDAR systems that include multiple integrated LIDAR measurement devices. In some embodiments, a delay time is set between the firing of each integrated LIDAR measurement device. In some examples, the delay time is greater than the time of flight of the measurement pulse sequence to and from an object located at the maximum range of the LIDAR device. In this manner, there is no cross-talk among any of the integrated LIDAR measurement devices. In some other examples, a measurement pulse is emitted from one integrated LIDAR measurement device before a measurement pulse emitted from another integrated LIDAR measurement device has had time to return to the LIDAR device. In these embodiments, care is taken to ensure that there is sufficient spatial separation between the areas of the surrounding environment interrogated by each beam to avoid cross-talk.

FIG. 11 is a diagram illustrative of an embodiment of a 3-D LIDAR system 100 in one exemplary operational scenario. 3-D LIDAR system 100 includes a lower housing 101 and an upper housing 102 that includes a domed shell element 103 constructed from a material that is transparent to infrared light (e.g., light having a wavelength within the spectral range of 700 to 1,700 nanometers). In one example, domed shell element 103 is transparent to light having a wavelengths centered at 905 nanometers.

As depicted in FIG. 11, a plurality of beams of light 105 are emitted from 3-D LIDAR system 100 through domed shell element 103 over an angular range, a, measured from a central axis 104. In the embodiment depicted in FIG. 11, each beam of light is projected onto a plane defined by the x and y axes at a plurality of different locations spaced apart from one another. For example, beam 106 is projected onto the xy plane at location 107.

In the embodiment depicted in FIG. 11, 3-D LIDAR system 100 is configured to scan each of the plurality of beams of light 105 about central axis 104. Each beam of light projected onto the xy plane traces a circular pattern centered about the intersection point of the central axis 104 and the xy plane. For example, over time, beam 106 projected onto the xy plane traces out a circular trajectory 108 centered about central axis 104.

FIG. 12 is a diagram illustrative of another embodiment of a 3-D LIDAR system 10 in one exemplary operational scenario. 3-D LIDAR system 10 includes a lower housing 11 and an upper housing 12 that includes a cylindrical shell element 13 constructed from a material that is transparent to infrared light (e.g., light having a wavelength within the spectral range of 700 to 1,700 nanometers). In one example, cylindrical shell element 13 is transparent to light having a wavelengths centered at 905 nanometers.

As depicted in FIG. 12, a plurality of beams of light 15 are emitted from 3-D LIDAR system 10 through cylindrical shell element 13 over an angular range, β. In the embodiment depicted in FIG. 12, the chief ray of each beam of light is illustrated. Each beam of light is projected outward into the surrounding environment in a plurality of different directions. For example, beam 16 is projected onto location 17 in the surrounding environment. In some embodiments, each beam of light emitted from system 10 diverges slightly. In one example, a beam of light emitted from system 10 illuminates a spot size of 20 centimeters in diameter at a distance of 100 meters from system 10. In this manner, each beam of illumination light is a cone of illumination light emitted from system 10.

In the embodiment depicted in FIG. 12, 3-D LIDAR system 10 is configured to scan each of the plurality of beams of light 15 about central axis 14. For purposes of illustration, beams of light 15 are illustrated in one angular orientation relative to a non-rotating coordinate frame of 3-D LIDAR system 10 and beams of light 15' are illustrated in another angular orientation relative to the non-rotating coordinate frame. As the beams of light 15 rotate about central axis 14, each beam of light projected into the surrounding environment (e.g., each cone of illumination light associated with each beam) illuminates a volume of the environment corresponding the cone shaped illumination beam as it is swept around central axis 14.

FIG. 13 depicts an exploded view of 3-D LIDAR system 100 in one exemplary embodiment. 3-D LIDAR system 100 further includes a light emission/collection engine 112 that rotates about central axis 104. In the embodiment depicted in FIG. 13, a central optical axis 117 of light emission/collection engine 112 is tilted at an angle, θ, with respect to central axis 104. As depicted in FIG. 13, 3-D LIDAR system 100 includes a stationary electronics board 110 mounted in a fixed position with respect to lower housing 101. Rotating electronics board 111 is disposed above stationary electronics board 110 and is configured to rotate with respect to stationary electronics board 110 at a predetermined rotational velocity (e.g., more than 200 revolutions per minute). Electrical power signals and electronic signals are communicated between stationary electronics board 110 and rotating electronics board 111 over one or more transformer, capacitive, or optical elements, resulting in a contactless transmission of these signals. Light emission/collection engine 112 is fixedly positioned with respect to the rotating electronics board 111, and thus rotates about central axis 104 at the predetermined angular velocity, ω.

As depicted in FIG. 13, light emission/collection engine 112 includes an array of integrated LIDAR measurement devices 113. In one aspect, each integrated LIDAR measurement device includes a light emitting element, a light detecting element, and associated control and signal conditioning electronics integrated onto a common substrate (e.g., printed circuit board or other electrical circuit board).

Light emitted from each integrated LIDAR measurement device passes through a series of optical elements 116 that collimate the emitted light to generate a beam of illumination light projected from the 3-D LIDAR system into the environment. In this manner, an array of beams of light 105, each emitted from a different LIDAR measurement device are emitted from 3-D LIDAR system 100 as depicted in FIG. 11. In general, any number of LIDAR measurement devices can be arranged to simultaneously emit any number of light beams from 3-D LIDAR system 100. Light reflected from an object in the environment due to its illumination by a particular LIDAR measurement device is collected by optical elements 116. The collected light passes through optical elements 116 where it is focused onto the detecting element of the same, particular LIDAR measurement device. In this manner, collected light associated with the illumination of different portions of the environment by illumination generated by different LIDAR measurement devices is separately focused onto the detector of each corresponding LIDAR measurement device.

Figure 14:
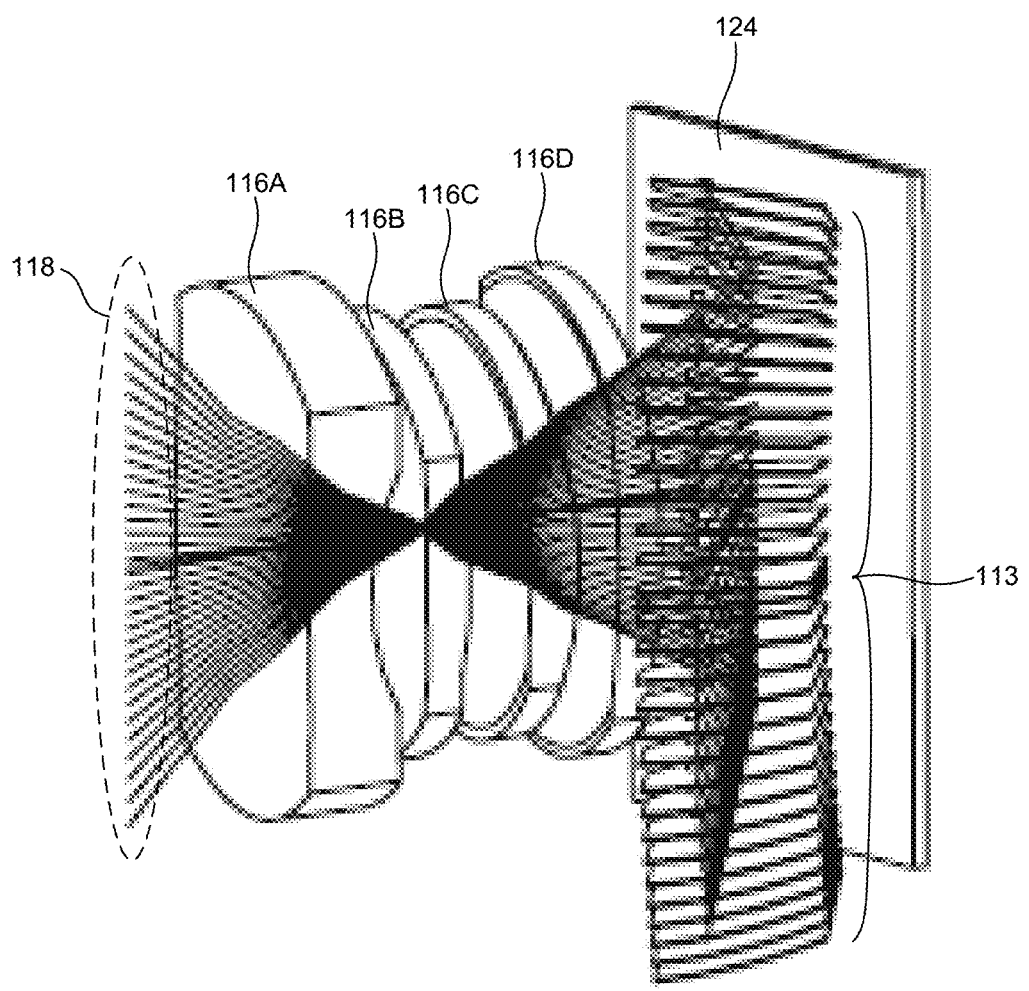
FIG. 14 depicts a view of optical elements 116 in greater detail.

FIG. 14 depicts a view of optical elements 116 in greater detail. As depicted in FIG. 14, optical elements 116 include four lens elements 116A-D arranged to focus collected light 118 onto each detector of the array of integrated LIDAR measurement devices 113. In the embodiment depicted in FIG. 14, light passing through optics 116 is reflected from mirror 124 and is directed onto each detector of the array of integrated LIDAR measurement devices 113. In some embodiments, one or more of the optical elements 116 is constructed from one or more materials that absorb light outside of a predetermined wavelength range. The predetermined wavelength range includes the wavelengths of light emitted by the array of integrated LIDAR measurement devices 113. In one example, one or more of the lens elements are constructed from a plastic material that includes a colorant additive to absorb light having wavelengths less than infrared light generated by each of the array of integrated LIDAR measurement devices 113. In one example, the colorant is Epolight 7276A available from Aako BV (The Netherlands). In general, any number of different colorants can be added to any of the plastic lens elements of optics 116 to filter out undesired spectra.

Figure 15:
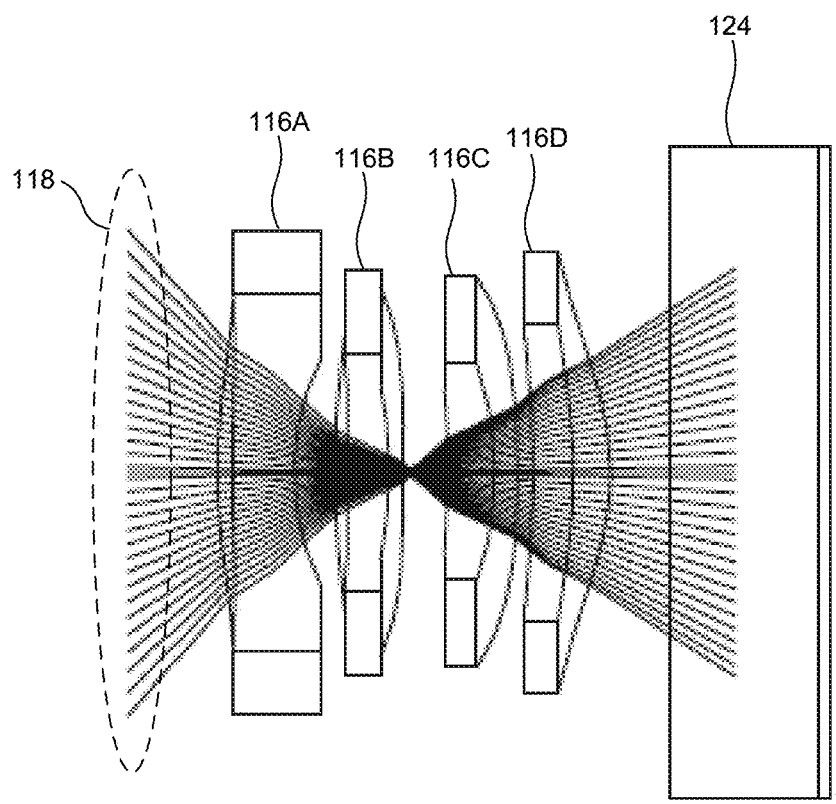
FIG. 15 depicts a cutaway view of optics 116 to illustrate the shaping of each beam of collected light 118.

FIG. 15 depicts a cutaway view of optics 116 to illustrate the shaping of each beam of collected light 118.

In this manner, a LIDAR system, such as 3-D LIDAR system 10 depicted in FIG. 2, and system 100, depicted in FIG. 11, includes a plurality of integrated LIDAR measurement devices each emitting a pulsed beam of illumination light from the LIDAR device into the surrounding environment and measuring return light reflected from objects in the surrounding environment.

In some embodiments, such as the embodiments described with reference to FIG. 11 and FIG. 12, an array of integrated LIDAR measurement devices is mounted to a rotating frame of the LIDAR device. This rotating frame rotates with respect to a base frame of the LIDAR device. However, in general, an array of integrated LIDAR measurement devices may be movable in any suitable manner (e.g., gimbal, pan/tilt, etc.) or fixed with respect to a base frame of the LIDAR device.

In some other embodiments, each integrated LIDAR measurement device includes a beam directing element (e.g., a scanning mirror, MEMS mirror etc.) that scans the illumination beam generated by the integrated LIDAR measurement device.

In some other embodiments, two or more integrated LIDAR measurement devices each emit a beam of illumination light toward a scanning mirror device (e.g., MEMS mirror) that reflects the beams into the surrounding environment in different directions.

In a further aspect, one or more integrated LIDAR measurement devices are in optical communication with an optical phase modulation device that directs the illumination beam(s) generated by the one or more integrated LIDAR measurement devices in different directions. The optical phase modulation device is an active device that receives a control signal that causes the optical phase modulation device to change state and thus change the direction of light diffracted from the optical phase modulation device. In this manner, the illumination beam(s) generated by the one or more integrated LIDAR devices are scanned through a number of different orientations and effectively interrogate the surrounding 3-D environment under measurement. The diffracted beams projected into the surrounding environment interact with objects in the environment. Each respective integrated LIDAR measurement device measures the distance between the LIDAR measurement system and the detected object based on return light collected from the object. The optical phase modulation device is disposed in the optical path between the integrated LIDAR measurement device and an object under measurement in the surrounding environment. Thus, both illumination light and corresponding return light pass through the optical phase modulation device.

Figure 16:
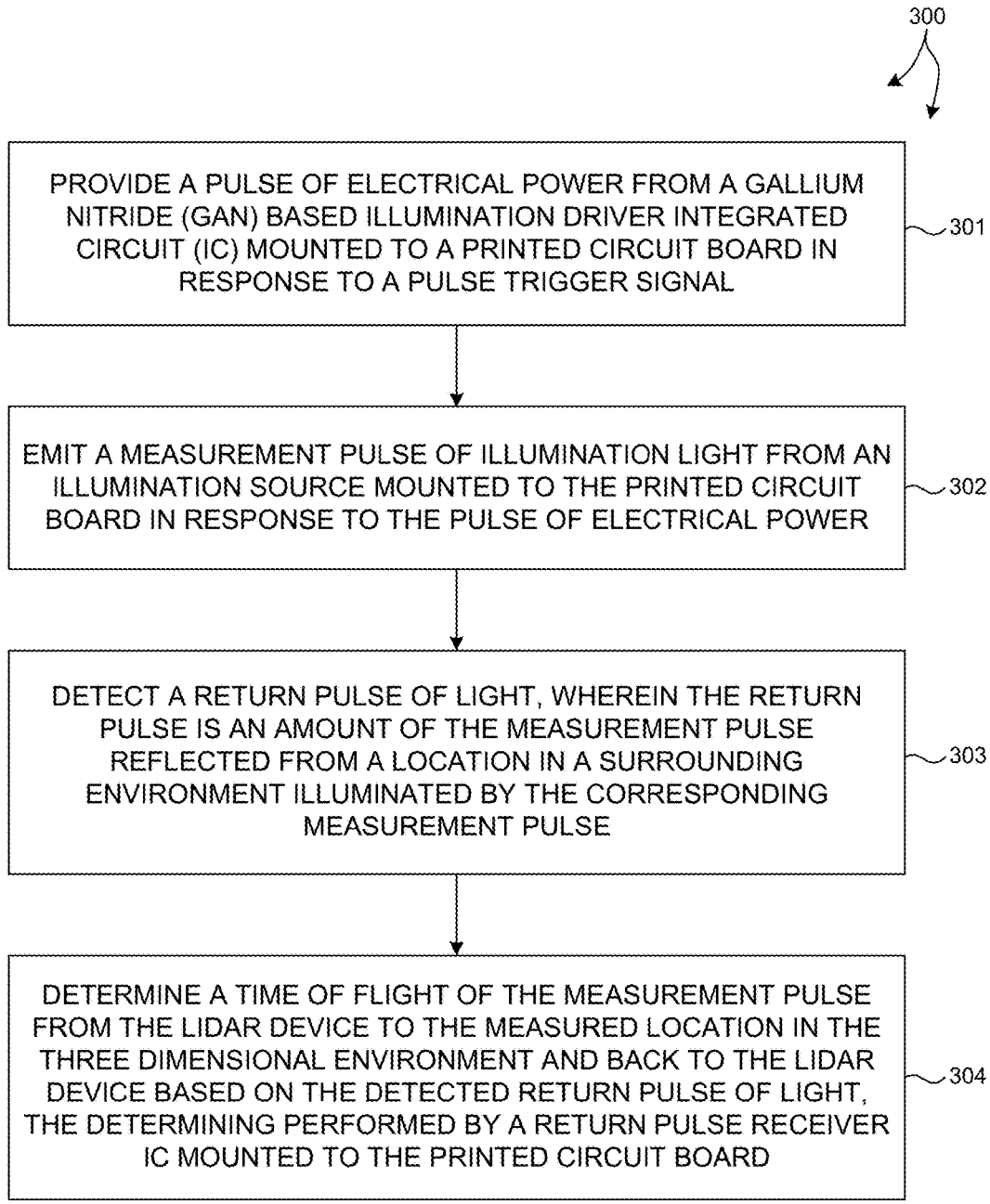
FIG. 16 depicts a flowchart illustrative of a method 300 of performing a LIDAR measurement by an integrated LIDAR measurement device in at least one novel aspect.

FIG. 16 illustrates a flowchart of a method 300 suitable for implementation by an integrated LIDAR measurement device as described herein. In some embodiments, integrated LIDAR measurement device 130 is operable in accordance with method 300 illustrated in FIG. 16. However, in general, the execution of method 300 is not limited to the embodiments of integrated LIDAR measurement device 130 described with reference to FIG. 1. These illustrations and corresponding explanation are provided by way of example as many other embodiments and operational examples may be contemplated.

In block 301, a pulse of electrical power is provided by a Gallium Nitride (GaN) based illumination driver integrated circuit (IC) mounted to a printed circuit board in response to a pulse trigger signal.

In block 302, a measurement pulse of illumination light is emitted in response to the pulse of electrical power from an illumination source mounted to the printed circuit board.

In block 303, a return pulse of light is detected. The return pulse is an amount of the measurement pulse reflected from a location in a surrounding environment illuminated by the corresponding measurement pulse.

In block 304, a time of flight of the measurement pulse from the LIDAR device to the measured location in the three dimensional environment and back to the LIDAR device is determined by return pulse receiver IC mounted to the printed circuit board based on the detected return pulse of light.

A computing system as described herein may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions implementing methods such as those described herein may be transmitted over a transmission medium such as a wire, cable, or wireless transmission link. Program instructions are stored in a computer readable medium. Exemplary computer-readable media include read-only memory, a random access memory, a magnetic or optical disk, or a magnetic tape.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An integrated LIDAR measurement device, comprising:
    an illumination source mounted to a printed circuit board; and
    a Gallium Nitride (GaN) based illumination driver integrated circuit (IC) mounted to the printed circuit board, the illumination driver IC electrically coupled to the illumination source and a first electrical power source, wherein the illumination driver IC is configured to selectively electrically couple the illumination source to the first electrical power source in response to a pulse trigger signal, causing the illumination source to emit a measurement pulse of illumination light.

2. The integrated LIDAR measurement device of claim 1, wherein the first electrical power source provides a first voltage across a first node and a second node of the first electrical power source, wherein a first node of the illumination source is electrically coupled to the first node of the electrical power source, wherein the illumination driver IC is electrically coupled to a second node of the illumination source and the second node of the first electrical power source, and wherein the illumination driver IC is configured to selectively electrically couple the second node of the illumination source to the second node of the first electrical power source in response to the pulse trigger signal.

3. The integrated LIDAR measurement device of claim 2, wherein the GaN based illumination driver IC comprises:

a first field effect transistor (FET) having a source, a drain coupled to a first node of a second electrical power source, and a gate configured to receive a gate charge control signal;
a second FET having a drain coupled to the source of the first FET, a source coupled to a second node of the second electrical power source, and a gate configured to receive a gate discharge control signal; and
a third FET having a gate coupled to the source of the first FET and the drain of the second FET, a drain coupled to the second node of the illumination source, and a source coupled to the second node of the first electrical power source, wherein the gate charge control signal causes the gate of the third FET to be selectively coupled to the first node of the second electrical power source, and wherein the gate discharge control signal causes the gate of the third FET to be selectively coupled to the second node of the second electrical power source.

4. The integrated LIDAR measurement device of claim 2, further comprising:
a first field effect transistor (FET) having a source, a drain coupled to a first node of a second electrical power source, and a gate configured to receive a gate charge control signal;
a second FET having a drain coupled to the source of the first FET, a source coupled to a second node of the second electrical power source, and a gate configured to receive a gate discharge control signal; and
a first plurality of FETS each having a drain coupled to the second node of the illumination source, a source coupled to the second node of the first electrical power source, and a gate selectively coupled to the source of the first FET and the drain of the second FET.

5. The integrated LIDAR measurement device of claim 4, wherein a FET selection signal determines whether the gate of each of the first plurality of FETS is electrically coupled to the source of the first FET and the drain of the second FET.

6. The integrated LIDAR measurement device of claim 5, wherein the gate of each of the first plurality of FETS is selectively coupled to the source of the first FET and the drain of the second FET based on a first bit of the FET selection signal, and further comprising:
a second plurality of FETS each having a drain coupled to the second node of the illumination source, a source coupled to the second node of the first electrical power source, and a gate selectively coupled to the source of the first FET and the drain of the second FET based on a second bit of the FET selection signal.

7. The integrated LIDAR measurement device of claim 6, wherein the first plurality of FETS is a different number of FETS than the second plurality of FETS.

8. The integrated LIDAR measurement device of claim 1, wherein the GaN based illumination driver IC includes a power save control module that supplies a controlled amount of electrical power to a portion of the GaN based illumination driver IC based on the pulse trigger signal.

9. The integrated LIDAR measurement device of claim 8, wherein the portion of the GaN based illumination driver IC includes any of a pulse amplitude control circuit, a pulse termination generator; and a FET selection circuit.

10. The integrated LIDAR measurement device of claim 8, wherein the power save control module includes:
a resistor having a first node and a second node, wherein the pulse trigger signal is supplied at the first node of the resistor;

a capacitor having a first node coupled to the first node of the resistor and a second node coupled to a second node of a second electrical power source;

a first FET having a source coupled to the second node of the capacitor, a gate coupled to the second node of the resistor, and a drain; and a second FET having a gate coupled to the drain of the first FET, a drain coupled to a first node of a second electrical power source, wherein the controlled amount of electrical power is provided at a source of the second FET.

11. The integrated LIDAR measurement device of claim 1, wherein the GaN based illumination driver IC includes a pulse initiation signal generator that generates a pulse initiation signal to a portion of the GaN based illumination driver IC based on the pulse trigger signal.

12. The integrated LIDAR measurement device of claim 11, wherein the pulse initiation signal generator includes:

a resistor having a first node and a second node, wherein the first node is coupled to a first node of a second electrical power source;

a FET having a source coupled to a second node of the second electrical power source, a drain coupled to the second node of the resistor, and a gate, wherein the pulse trigger signal is provided at the gate of the FET, and wherein the pulse initiation signal is provided at the drain of the FET.

13. The integrated LIDAR measurement device of claim 11, wherein the GaN based illumination driver IC includes a pulse termination signal generator that generates a pulse termination signal to a portion of the GaN based illumination driver IC based on the pulse trigger signal, wherein a delay between the pulse initiation signal and the pulse termination signal is based on a pulse width control signal provided to the GaN based illumination driver IC.

14. The integrated LIDAR measurement device of claim 1, wherein the GaN based illumination driver IC includes a pulse amplitude control circuit that controls an amplitude of the measurement pulse of illumination light based on an amplitude control signal provided to the GaN based illumination driver IC.

15. The integrated LIDAR measurement device of claim 14, wherein the pulse amplitude control circuit includes:

a first resistor having a first node and a second node, wherein the pulse amplitude control signal is provided on the first node of the first resistor;

a FET having a source, a gate coupled to the second node of the first resistor, and a drain coupled to a node of a second electrical power source;

a second resistor having a first node coupled to the source of the FET and a second node coupled to a gate of a charge control FET; and a capacitor having a first node coupled to the second node of the first resistor and a second node coupled to the second node of the second resistor.

16. The integrated LIDAR measurement device of claim 1, further comprising:

a photodetector mounted to the printed circuit board, the photodetector configured to detect a return pulse of light and generate an output signal indicative of the detected return pulse, wherein the return pulse is an amount of the measurement pulse reflected from a location in a surrounding environment illuminated by the corresponding measurement pulse;

a return pulse receiver IC mounted to the printed circuit board, the return pulse receiver configured to determine a time of flight of the measurement pulse from the LIDAR device to the measured location in the three dimensional environment and back to the LIDAR device based on the output signal, wherein the return pulse receiver IC generates the pulse trigger signal and communicates the pulse trigger signal to the GaN based illumination driver IC.

17. A LIDAR measurement system, comprising:

a plurality of integrated LIDAR measurement devices, each comprising:

an illumination source mounted to a printed circuit board;

a Gallium Nitride (GaN) based illumination driver integrated circuit (IC) mounted to the printed circuit board, the illumination driver IC electrically coupled to the illumination source and a first electrical power source, wherein the illumination driver IC is configured to selectively couple the illumination source and the electrical power source in response to a pulse trigger signal, causing the illumination source to emit a measurement pulse of illumination light; and a return pulse receiver IC mounted to the printed circuit board, the return pulse receiver configured to determine a time of flight of the measurement pulse from the LIDAR device to a measured location in the three dimensional environment and back to the LIDAR device, wherein the return pulse receiver IC generates and communicates the pulse trigger signal to the GaN based illumination driver IC; and a master controller configured to generate a plurality of pulse command signals, each communicated to a different integrated LIDAR measurement device of the plurality of integrated LIDAR measurement devices, wherein each return pulse receiver IC generates the corresponding pulse trigger signal based on the received pulse command signal.

18. The LIDAR measurement system of claim 17, wherein the GaN based illumination driver IC includes a pulse amplitude control circuit that controls an amplitude of the measurement pulse of illumination light based on an amplitude control signal communicated from the return pulse receiver IC to the GaN based illumination driver IC.

19. The LIDAR measurement system of claim 17, wherein the GaN based illumination driver IC generates a pulse initiation signal and a pulse termination signal in response to the pulse trigger signal, and wherein a delay between the pulse initiation signal and the pulse termination signal is based on a pulse width control signal communicated from the return pulse receiver IC to the GaN based illumination driver IC.

20. The LIDAR measurement system of claim 17, the GaN based illumination driver IC including a plurality of field effect transistors (FETS) each configured to selectively couple the illumination source and the electrical power source, wherein a FET selection signal determines a number of the plurality of FETS that selectively couple the illumination source and the electrical power source, and wherein the FET selection signal is communicated from the return pulse receiver IC to the GaN based illumination driver IC.

21. An integrated LIDAR measurement device, comprising:

an illumination source mounted to a printed circuit board, the illumination source configured to provide a measurement pulse of illumination light;

a Gallium Nitride (GaN) based illumination driver integrated circuit (IC) mounted to the printed circuit board, the illumination driver IC electrically coupled to the illumination source, wherein the illumination driver IC is configured to cause the illumination source to provide the measurement pulse of illumination light in response to a pulse trigger signal;

a photodetector mounted to the printed circuit board, the photodetector configured to detect a first amount of the measurement pulse of illumination light due to crosstalk between the illumination source and the photodetector and a valid return pulse of light reflected from a location in a surrounding environment illuminated by a second amount of the measurement pulse; and a return pulse receiver IC mounted to the printed circuit board, the return pulse receiver IC configured to a difference in time between a time when the first amount of the measurement pulse is detected and a time when the valid return pulse of light is detected.

22. A method comprising:

providing a pulse of electrical power from a Gallium Nitride (GaN) based illumination driver integrated circuit (IC) mounted to a printed circuit board in response to a pulse trigger signal;

emitting a measurement pulse of illumination light in response to the pulse of electrical power from an illumination source mounted to the printed circuit board;

detecting a return pulse of light, wherein the return pulse is an amount of the measurement pulse reflected from a location in a surrounding environment illuminated by the corresponding measurement pulse; and determining a time of flight of the measurement pulse from the LIDAR device to the measured location in the three dimensional environment and back to the LIDAR device based on the detected return pulse of light, the determining performed by a return pulse receiver IC mounted to the printed circuit board.

23. The method of claim 22, further comprising:

controlling an amount of electrical power supplied to any of a pulse amplitude control circuit, a pulse termination generator, and a FET selection circuit of the GaN based illumination driver IC based on the pulse trigger signal.

24. The method of claim 22, wherein a duration of the pulse of electrical power is determined by a pulse initiation signal and a pulse termination signal generated by the GaN based illumination driver IC, wherein a delay between the pulse initiation signal and the pulse termination signal is based on a pulse width control signal communicated from the return pulse receiver IC to the GaN based illumination driver IC.

25. The method of claim 22, wherein the GaN based illumination driver IC includes a pulse amplitude control circuit that controls an amplitude of the measurement pulse of illumination light based on an amplitude control signal communicated from the return pulse receiver IC to the GaN based illumination driver IC.

26. The method of claim 22, wherein the pulse trigger signal is communicated from the return pulse receiver IC to the GaN based illumination driver IC.

* * * * *